(12) United States Patent
Inoue

(10) Patent No.: US 7,027,342 B2
(45) Date of Patent: Apr. 11, 2006

(54) SEMICONDUCTOR MEMORY DEVICE

(75) Inventor: Koji Inoue, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/154,853

(22) Filed: Jun. 15, 2005

(65) Prior Publication Data
US 2005/0276138 A1 Dec. 15, 2005

(30) Foreign Application Priority Data
Jun. 15, 2004 (JP) .............................. 2004-177503

(51) Int. Cl.
*G11C 7/02* (2006.01)
(52) U.S. Cl. .................. 365/210; 365/148; 365/189.09
(58) Field of Classification Search ................ 365/210, 365/189.09, 148, 196, 189.07
See application file for complete search history.

(56) References Cited

U.S. PATENT DOCUMENTS

| | | | |
|---|---|---|---|
| 6,314,014 B1* | 11/2001 | Lowrey et al. ............. | 365/100 |
| 6,778,420 B1* | 8/2004 | Parkinson .................... | 365/100 |
| 6,781,860 B1* | 8/2004 | Parkinson .................... | 365/100 |
| 2005/0169038 A1* | 8/2005 | Inoue et al. ................ | 365/148 |
| 2005/0276091 A1* | 12/2005 | Inoue ......................... | 365/148 |

FOREIGN PATENT DOCUMENTS

JP 2002-8369 A 1/2002

* cited by examiner

*Primary Examiner*—Richard Elms
*Assistant Examiner*—Hien Nguyen
(74) *Attorney, Agent, or Firm*—Morrison & Foerster LLP

(57) ABSTRACT

In a semiconductor memory device having a crosspoint-type memory cell array, each reference level between two adjacent memory levels when memory levels of multi-level information stored in a memory cell are arranged in order of size of resistance values of a corresponding variable resistive element is defined by a reference current in a middle state between a first and a second current states. In the first current state, a readout current of high resistance selected cell in which the resistance is higher in the two adjacent memory levels becomes the largest state depending on a distribution pattern of a resistance state of the other unselected cell. In the second current state, a readout current of low resistance selected cell in which the resistance is lower in the two adjacent memory levels becomes a smallest state depending on a distribution pattern of a resistance state of the other unselected memory cell.

8 Claims, 31 Drawing Sheets

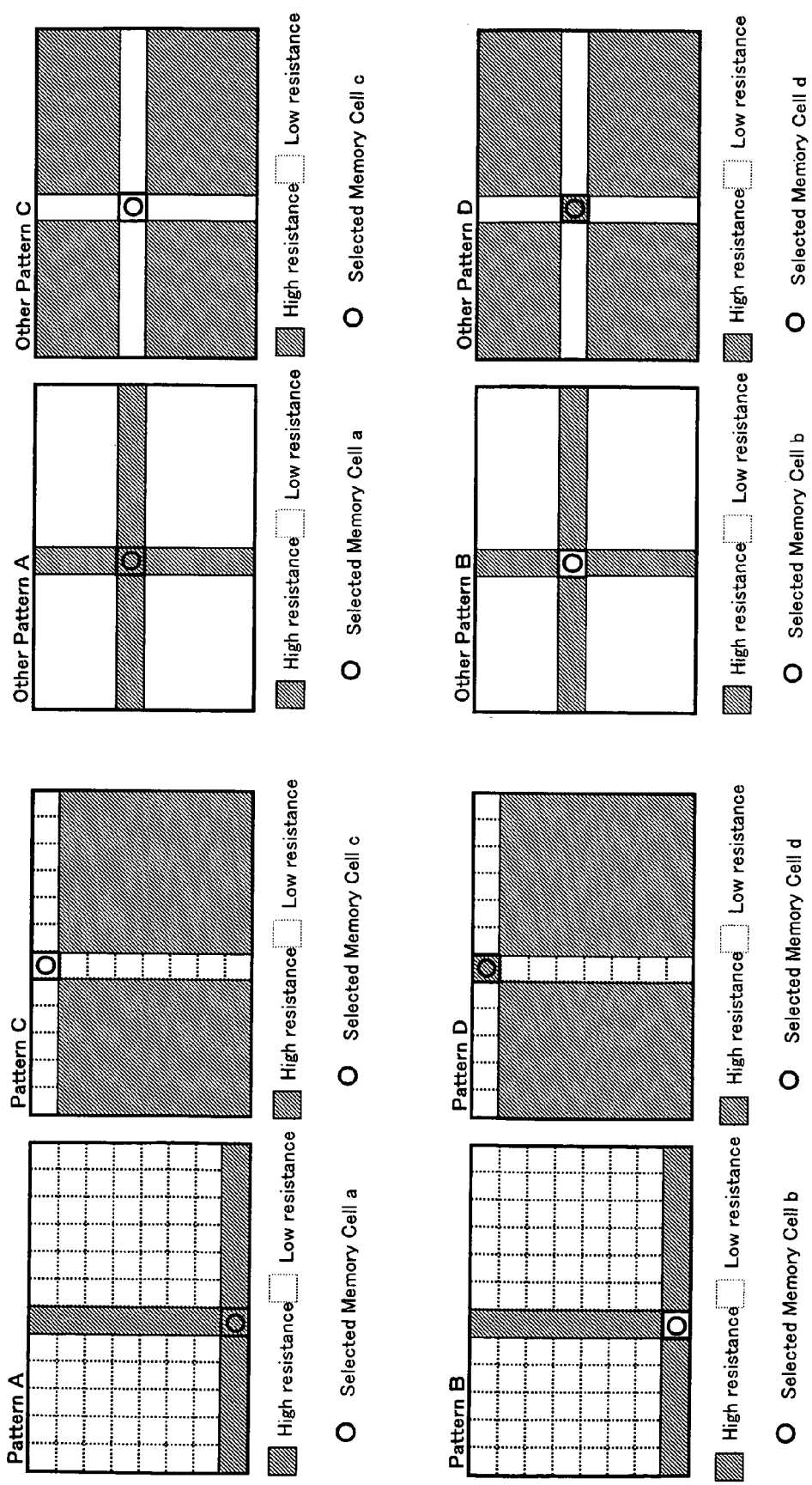

| Memory Level | (1,1) | (1,0) | (0,1) | (0,0) |
|---|---|---|---|---|
| Upper Limit Value | $A_H$ | $(A_H), B_L$ | $(A_H), B_L$ | |
| Lower Limit Value | | $(C_L), D_H$ | $(C_L), D_H$ | $(C_L), D_H$ |

Fig.13

SEMICONDUCTOR MEMORY DEVICE

CROSS REFERENCE TO RELATED APPLICATION

This Nonprovisional application claims priority under 35 U.S.C. §119(a) on Patent Application No. 2004-177503 filed in Japan on Jun. 15, 2004, the entire contents of which are hereby incorporated by reference.

BACKGROUND OF THE INVENTION

1. Field of the Invention

The present invention relates to a semiconductor memory device having a crosspoint-type memory cell array in which memory cells are arranged in a row direction and a column direction, one ends of the respective memory cells in the same row are connected to the same row selection line, and the other ends of the respective memory cells are connected to the same column selection line. More particularly, the present invention relates to a semiconductor memory device in which a memory cell comprises a variable resistive element which stores three or more multi-level information depending on a change in electric resistance.

2. Description of the Related Art

Recently, a crosspoint-type semiconductor memory device (referred to as the "crosspoint memory" occasionally hereinafter) comprising a memory cell array in which a memory cell does not comprise a selection element and a memory element is directly connected to a row selection line (referred to as the "data line" hereinafter) and a column selection line (referred to as the "bit line" hereinafter) in a memory cell has been increasingly developed (refer to Japanese Unexamined Patent Publication No. 2002-8369, for example).

According to "Equivalent Voltage Detection Method for Resistive Cross Point Memory Cell Array" disclosed in the Japanese Unexamined Patent Publication No. 2002-8369, a predetermined voltage is supplied to each of the data line and bit line to detect a resistance state of a memory cell of an MRAM (Magnetic Random Access Memory). According to this patent document 1, when a selected memory cell is read, a resistance state, that is, a memory state of the selected memory cell is detected by applying a first voltage to a selected data line and applying a second voltage lower than the first voltage to selected and unselected bit lines and unselected data lines.

FIG. 15 shows a circuit constitution of a memory cell array of a conventional crosspoint memory, set levels of voltages applied to data lines and bit lines, and current paths. According to the crosspoint memory shown in FIG. 15, when a selected memory cell is read, a resistance state of the selected memory cell is detected by applying a third voltage V2 to a selected bit line and applying a fourth voltage V1 which is higher than the third voltage V2 to selected and unselected data lines and unselected bit lines.

FIG. 15 shows a case where when a resistance state of a memory cell positioned at an intersection of a data line D0 and a bit line B0 is read, the resistance state of the object memory cell is determined by reading a current of the selected data line D0.

FIG. 16 shows a voltage setting of each data line and bit line and current paths when the resistance value of memory cell positioned at the intersection of the data line D0 and bit line B0 is read on the side of the bit line. In FIG. 16, similar to the voltage setting in the above patent document 1, when the selected memory cell is read, a resistance state of the selected memory cell is detected by applying a first voltage V1 to a selected data line and applying a second voltage V2 lower than the first voltage V1 to selected and unselected bit lines and unselected data lines. In this case, the resistance state of the object memory cell is determined by reading a current of the selected bit line B0.

FIG. 17 shows paths of leak currents $I_{leak}0$, $I_{leak}1$, ... $I_{leak}k$ generated when a readout current Id of a memory cell Md is measured. Reference character M in FIG. 17 virtually shows an ampere meter which measures the current IM on the selected data line. In a readout state shown in FIG. 17, voltages applied to bit lines and data lines are set in the same manner as that shown in FIG. 15. In this case, the readout current Id of the memory cell Md is shown by the following equation (1). In addition, a symbol of operation $\Sigma_{i=0 \ to \ k}$ shows an arithmetic sum in a range of i=0 to k.

$$Id = IM - \Sigma_{i=0 \ to \ k} I_{leak} i \quad (1)$$

FIG. 18 shows paths and direction of the leak current $\Sigma_{i=0 \ to \ k} I_{leak}1i$ generated when a readout current Id1 of a memory cell Md1 is measured, and direction of $\Sigma_{i=0 \ to \ k} I_{leak}2i$ generated when a readout current Id2 of a memory cell Md2 is measured. In a readout state shown in FIG. 18, voltages applied to bit lines and data lines are set in the same manner as that shown in FIG. 15. In this case, when a resistance value of the memory cell Md1 is low in the memory cell connected to the selected bit line, a voltage of a data line D1 is lowered because of voltage division corresponding to a resistance division ratio of an ON resistance value of a driver which drives the data line and a resistance value of the memory cell Md1.

Therefore, since a voltage at a contact point d1A of the memory cell Md1 and the data line D1 is lower than the other data line voltages, leak currents flowing from the bit line to the memory cell Md1 are generated. That is, the leak current (sneak current through an unselected memory cell) $\Sigma_{i=0 \ to \ k} I_{leak}1i$ is generated from the bit line to the memory cell Md1 through the data line D1. In this case, a relation between the readout current Id1 of the memory cell Md1 and a measured current IM1 in the data line D1 is shown by the following equation (2). Reference character M1 in FIG. 18 virtually shows an ampere meter which measures the current IM1.

$$IM1 = Id1 - \Sigma_{i=0 \ to \ k} I_{leak}1i \quad (2)$$

In addition, when a resistance value of the memory cell Md2 is high in the memory cell connected to the selected bit line, a voltage of a data line D2 is raised because of voltage division corresponding to a resistance division ratio of an ON resistance value of the driver which drives the data line and a resistance value of the memory cell Md2.

Therefore, since a voltage at a contact point d2A of the memory cell Md2 and the data line D2 is higher than the other data line voltages, leak currents (sneak currents through unselected memory cells) $\Sigma_{i=0 \ to \ k} I_{leak}2i$ flow from the data line D2 to the bit line. That is, the leak current $\Sigma_{i=0 \ to \ k} I_{leak}2i$ is generated from the data line D2 to a memory cell Mdx connected to the data line through the bit line. In this case, a relation between the readout current Id2 of the memory cell Md2 and a measured current IM2 in the data line D2 is shown by the following equation (3). Reference character M2 in FIG. 18 virtually shows an ampere meter which measures the current IM2.

$$IM2 = Id2 + \Sigma_{i=0 \ to \ k} I_{leak}2i \quad (3)$$

The reason why the leak current is generated depending on the resistance value of the memory cell to be read out is that an apparent resistance value exists in the data line and the bit line as shown in FIG. 19. More specifically, the apparent resistance value is a resistance value when the driver which drives the data line and the driver which drives the bit line are driven.

Specifically, FIG. 19 shows a case in which the voltages applied to the data line and the bit line are set in the same manner as that shown in FIG. 15. In order to set the voltages of the data line and the bit line, drivers A are needed as shown in FIG. 19. When the driver A is driven, the ON resistance (it is assumed that the resistance value is R) exists. When the resistance values of the memory cells on the selected bit line in the memory cell array, that is, R1, R2, R3 and R4 are different from each other, voltages Vdi (i=1 to 4) of the data lines 1 to 4 are shown by the following equation (4). In addition, it is assumed that V1 is a driving voltage of each data line and V2' is a voltage of the selected bit line.

$$Vdi=(V1-V2')\times Ri/(Ri+R) \quad (4)$$

As shown the equation (4), the voltage Vdi of each data line varies with Ri. Therefore, the voltage of the data line varies with the resistance value of the memory cell on the selected bit line and the leak current is generated.

FIG. 20 shows one example of a circuit serving as a data line driver and an amplifier. The circuit serving as the data line driver and the amplifier applies a predetermined voltage (power supply voltage Vcc, for example) to the selected and unselected data lines. A P channel MOSFET (referred to as the "PMOS" hereinafter) P0 in the circuit serving as the data line driver and the amplifier supplies a drive current Ix which accesses a memory cell from the data line. When the resistance value of the accessed memory cell is high, since a current supplied from the PMOS (P0) of the data line drive circuit in FIG. 20 to the memory cell array is reduced, the gate voltage of the PMOS is raised. Meanwhile, when the resistance value of the accessed memory cell is low, since a current supplied from the PMOS (P0) of the data line drive circuit in FIG. 20 to the memory cell array is increased, the gate voltage of the PMOS (PMOS) is lowered. The gate voltage of the PMOS (P0) is amplified by the PMOS (P1) and the load transistor (N channel MOSFET) in a data line current amplification circuit in FIG. 20 and the amplified voltage V0 is outputted.

FIG. 21 shows an example of the bit line drive circuit shown in FIG. 19. The bit line drive circuit comprise a load circuit P0 in a PMOS and a column selection circuit comprising two CMOS transfer gates. According to the column selection circuit, when the bit line is selected by a decode output of a column address decoder (column decoder), the right CMOS transfer gate in FIG. 21 is turned on, the ground voltage Vss is supplied to the bit line, and when the bit line is not selected, the left CMOS transfer gate in FIG. 21 is turned on and a voltage which drops from the power supply voltage Vcc by a threshold voltage of the PMOS (P0) is supplied. In addition, the voltage supplied to the bit line when the bit line is not selected is at the same voltage level as that of the voltage supplied to the data line.

As described above, the measured current IM1 in the data line D1 in FIG. 18 is as shown in the equation (2) and the measured current IM2 in the data line D2 in FIG. 18 is as shown in the equation (3). As shown in the equations (2) and (3), when the predetermined voltage is applied to the data line and the bit line at the time of readout using the conventional circuit serving as the data line driver and amplifier and the bit line driver, since the current direction of the leak current varies according to the resistance value of the memory cell to be read out, in the case the leak current value is great, it is difficult to lead the memory cell readout currents Id1 and Id2 from the measured currents IM1 and IM2 measured on the data line.

Meanwhile, the resistance value of the selected memory cell can be read by comparing the readout current or the voltage level converted from that current with the predetermined reference current or reference voltage by the comparison circuit and the resistance value, that is, the memory level of the selected memory cell can be determined by the output of the comparison circuit (refer to Japanese Unexamined Patent Publication No. 2002-8369). Here, two memory levels of the readout current or the converted voltage from that current corresponding to two resistance values of the selected memory cell can be determined by setting the reference current or the reference voltage at a middle value of the readout current or its converted voltage.

However, since the leak current in the same direction or in the opposite direction to the readout current exists in addition to variation in resistance value of the selected memory cell itself, when the reference current or the reference voltage is simply set at the middle value of the readout current or its converted voltage provided from the standard resistance value corresponding to each memory level of the selected memory cell, it is highly possible that the appropriate reference current or reference voltage cannot be provided because of the leak current. Therefore, even when the readout margin is provided for reading one memory level, since the readout margin for reading the other memory level becomes small, the reading cannot be performed if the worst case comes to the worst.

Especially, when the memory cell stores three or more multi-level information, an influence by the leak current becomes large and it becomes more difficult to set the reference current or the reference voltage.

Furthermore, in the case where the voltage level setting to read the resistance value of the memory cell on the bit line side shown in FIG. 16 is used, the current direction of the leak current when the resistance value of the selected memory cell is high is shown in FIG. 22.

In FIG. 22, when the resistance value of the selected memory cell is high, the direction of the memory cell current Id1 flowing in the bit line B0 is the same as that of the leak currents $I_{leak}0, I_{leak}1, \ldots I_{leak}k$. In addition, as shown in FIG. 23, when the value is low, the direction of the memory cell current Id2 flowing in the bit line B0 is the opposite to that of the leak currents $I_{leak}00, I_{leak}01, \ldots I_{leak}0k$. In this case, since the values of the measured current IM1 and IM2 largely vary with the leak current value, the memory cell currents Id1 and Id2 cannot be correctly detected. As shown in FIGS. 22 and 23, in the setting method of the voltages to the data line and bit line shown in FIG. 16, the leak current flows backward depending on the resistance value of the selected memory cell similar to the leak currents shown in FIGS. 17 and 18.

Next, a description will be made of a case where the memory cell array is accessed (selected) by the bank with reference to FIG. 24. FIG. 24 shows a constitution in which the memory cell array is divided into a plurality of banks. In this case, in addition to the ON resistance of the driver described with reference to FIG. 19, an ON resistance of an array selection transistor BSi is added. Therefore, the voltage fluctuation of the data line becomes large as compared with the single memory cell array constitution shown in FIG. 19. When a memory cell in the memory cell array 10 (bank 1) in FIG. 24 is read, it is necessary to turn on a transistor in a transistor column BS1 (bank selection transistor column) which selects the memory cell array 10 (bank 1). In addition, in order not to select other memory cell arrays MR0, MR2, and MR3 (banks 0, 2 and 3), it is necessary to turn off all transistors in array selection transistor columns BS0, BS2 and BS3. Thus, when the transistors in the array selection transistor column BS1 are turned on, ON resistances Rbs1, Rbs2, ..., Rbsx of the transistors are provided on the data line. Therefore, a voltage Vdij of the data line in each bank shown in FIG. 24 is shown by the following equation (5), where "i" designates an order of the data line in the same bank, "j" designates an order of the bank, and "Rij" designates a resistance value of the memory cell connected to a selected bit line and i-th data line in a bank j.

$$V{dij}=(V1-V2')\times Rij/(Rij+R+Rbsj) \qquad (5)$$

As shown in the equation (5), the voltage is more largely fluctuated than the voltage of the data line shown in the equation (4). That is, since the leak current caused by the voltage fluctuation of the data line is increased, when the memory cell stores three or more multi-level information especially, the influence of the leak current is increased and the readout of the memory cell becomes more difficult or becomes impossible.

SUMMARY OF THE INVENTION

The present invention has been made in view of the above problems and it is an object of the present invention to improve a readout margin in consideration of an influence of a leak current which varies with a resistance value of a memory cell to be read, which comprises a variable resistive element storing three or more multi-level information.

In order to attain the above object, as a first characteristic, a semiconductor memory device according to the present invention comprises a memory cell array in which memory cells each comprising variable resistive elements which store three or more multi-level information depending on a change in electric resistance are arranged in row direction and column direction in the shape of an array, a plurality of row selection lines extending in the row direction and a plurality of column selection lines extending in the column direction are provided, respective one ends of the variable resistive elements of the memory cells in the same row are connected to the same row selection line and respective the other ends of the variable resistive elements of the memory cells are connected to the same column selection line, a column readout voltage supply circuit which supplies a predetermined first voltage when readout is selected, and supplies a second voltage different from the first voltage when the readout is not selected, to each of the column selection lines, a row readout voltage supply circuit which supplies the second voltage to each of the row selection lines at the time of readout, and a sense circuit which senses a current flowing in a selected row selection line separately from a current flowing in unselected row selection lines and senses an electric resistance state of a selected memory cell at the time of readout, wherein each reference level between two adjacent memory levels when the memory levels of multi-level information stored in the memory cell are arranged in order of size of resistance values of the corresponding variable resistive element is defined by a reference current in a middle state between a first current state in which a current flowing in the row selection line selected when a high resistance memory cell in which the electric resistance of the selected memory cell is in a higher resistance state in the two memory levels is read out becomes the largest state depending on a distribution pattern of an electric resistance state of the other unselected memory cell in the memory cell array, and a second current state in which a current flowing in the row selection line selected when a low resistance memory cell in which the electric resistance of the selected memory cell is in a lower resistance state in the two memory levels is read out becomes the smallest state depending on the distribution pattern of the electric resistance state of the other unselected memory cell in the memory cell array, and the sense circuit is constituted so as to be able to compare the current flowing in the selected row selection line with the reference current corresponding to the reference level.

Furthermore, according to the semiconductor device according to the first characteristic, it is preferable that the sense circuit comprises a first current-voltage conversion circuit part which converts the current flowing in the selected row selection line to a readout voltage level, a first reference current generation circuit which approximately implements the first current state of each reference level, a second reference current generation circuit which approximately implements the second current state of each reference level, a second current-voltage conversion circuit part which converts the reference current of the reference level to a reference voltage level, and a comparison circuit which compares the readout voltage level with the reference voltage level.

According to the semiconductor memory device of the first characteristic of the present invention, since the current flowing in the row selection line in a middle state of the state in which an influence of the leak current of one resistance state becomes maximum to the other, between any two adjacent resistance states of the states corresponding to the three or more memory levels of the memory cell to be read is set as the reference value and the readout current of the row selection line connected to the memory cell to be read is compared with the reference value, even when the memory level of the memory cell to be read is either of the two resistance states, a maximum readout margin can be provided. That is, even when any memory data of the three or more memory levels is read, the readout margin can be improved.

Still furthermore, as a second characteristic, according to the semiconductor device of the first characteristic of the present invention, each of the first reference current generation circuit and the second reference current generation circuit at each reference level comprises a reference memory cell array comprising reference memory cells formed of the same variable resistive elements as the memory cells and having the equivalent constitution to the memory cell array, a reference column readout voltage supply circuit whose constitution is equivalent to that of the column readout voltage supply circuit, and a reference row readout voltage supply circuit whose constitution is equivalent to that of the row readout voltage supply circuit, a distribution pattern of an electric resistance state of the reference memory cell in the reference memory cell array in the first reference current generation circuit at each reference level is set in a first distribution pattern in which the current flowing in the row selection line of the selected reference memory cell array becomes the first current state at each reference level, and a distribution pattern of an electric resistance state of the reference memory cell in the reference memory cell array in the second reference current generation circuit at each reference level is set in a second distribution pattern in which a current flowing in the row selection line of the selected reference memory cell array becomes the second current state of each reference level.

According to the semiconductor memory device of the second characteristic of the present invention, since the first reference current generation circuit which approximately implements the first current state and the second reference current generation circuit which approximately implements the second current state at each reference level in the third characteristic can be surely and easily implemented by the two reference memory cell arrays set in the different distribution patterns, the effect of the semiconductor memory device according to the first characteristic of the present invention can be concretely provided.

Still furthermore, as a third characteristic, the semiconductor memory device of the second characteristic comprises a plurality of memory cell arrays, in which the sense circuit for at least two memory cell arrays in the plurality of memory cell arrays uses the first reference current generation circuit and the second reference current generation circuit in common.

According to the semiconductor memory device of the third characteristic of the present invention, since the first reference current generation circuit which approximately implements the first current state and the second reference current generation circuit which approximately implements the second current state are used among the plurality of memory cell arrays in common, a relative circuit size (that is, an occupied area on a semiconductor chip) of the first reference current generation circuit and the second reference current generation circuit can be reduced, so that the semiconductor memory device can be manufactured at low cost.

BRIEF DESCRIPTION OF THE DRAWINGS

FIG. 10A shows a distribution pattern in which the location dependence of the memory cell in the memory cell array is considered and FIG. 10B shows a distribution pattern in which the location dependence is not considered in the various distribution patterns A, B, C and D of the resistance states of the memory cells;

FIG. 13 is a list showing a relation between the resistance states of the four-level memory cell in the memory cell array and the distribution patterns providing an upper limit value and a lower limit value of a readout current flowing in a selected memory cell after fluctuation by a leak current;

DETAILED DESCRIPTION OF THE INVENTION

An embodiment of a semiconductor memory device according to the present invention (referred to as the "device of the present invention" hereinafter) will be described with reference to the drawings.

Figure 1:
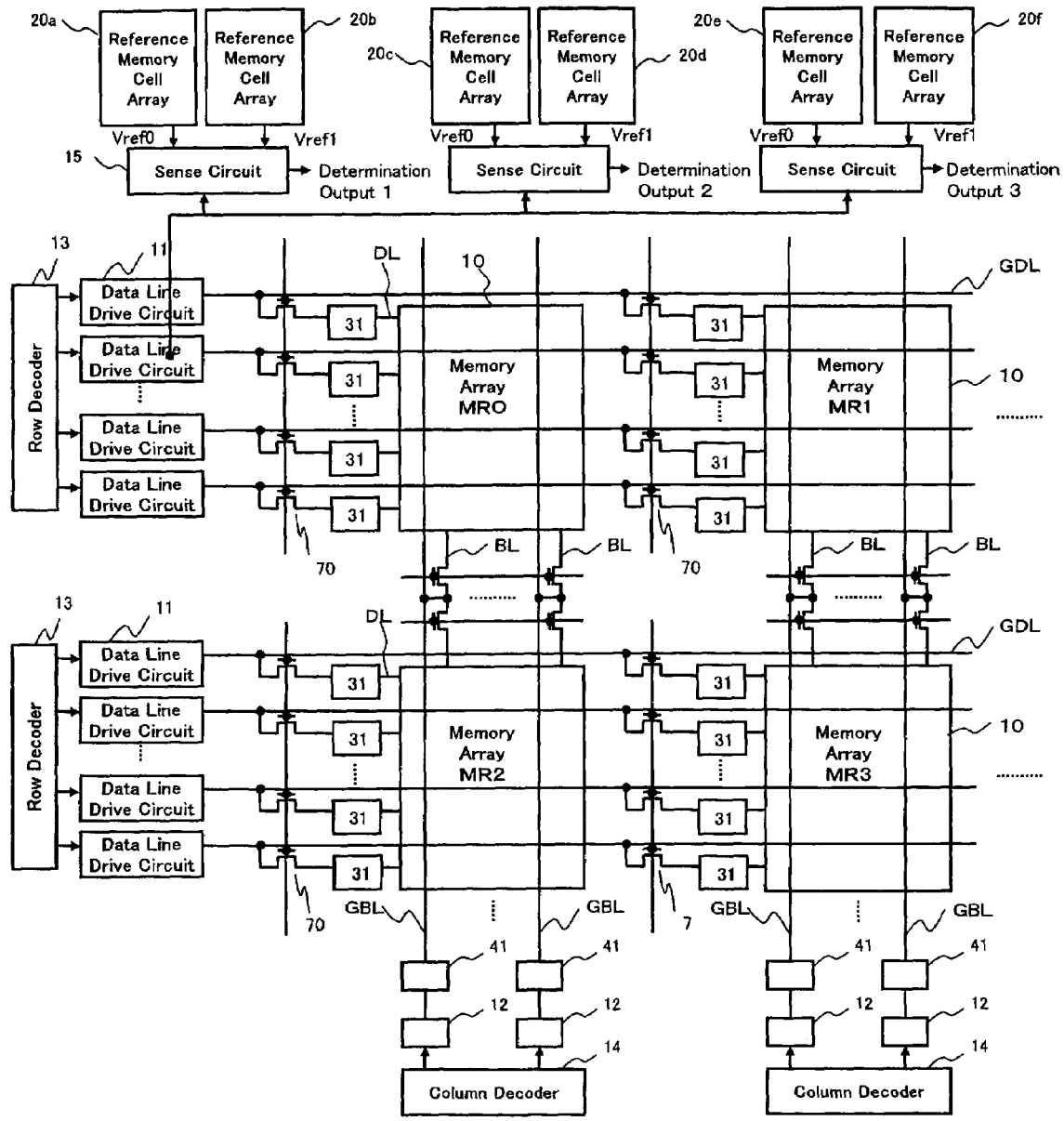
FIG. 1 is a circuit block diagram showing a memory cell array constitution and a block constitution of a main part regarding a readout operation of each memory cell array according to one embodiment of the semiconductor memory device of the present invention.
Figure 2:
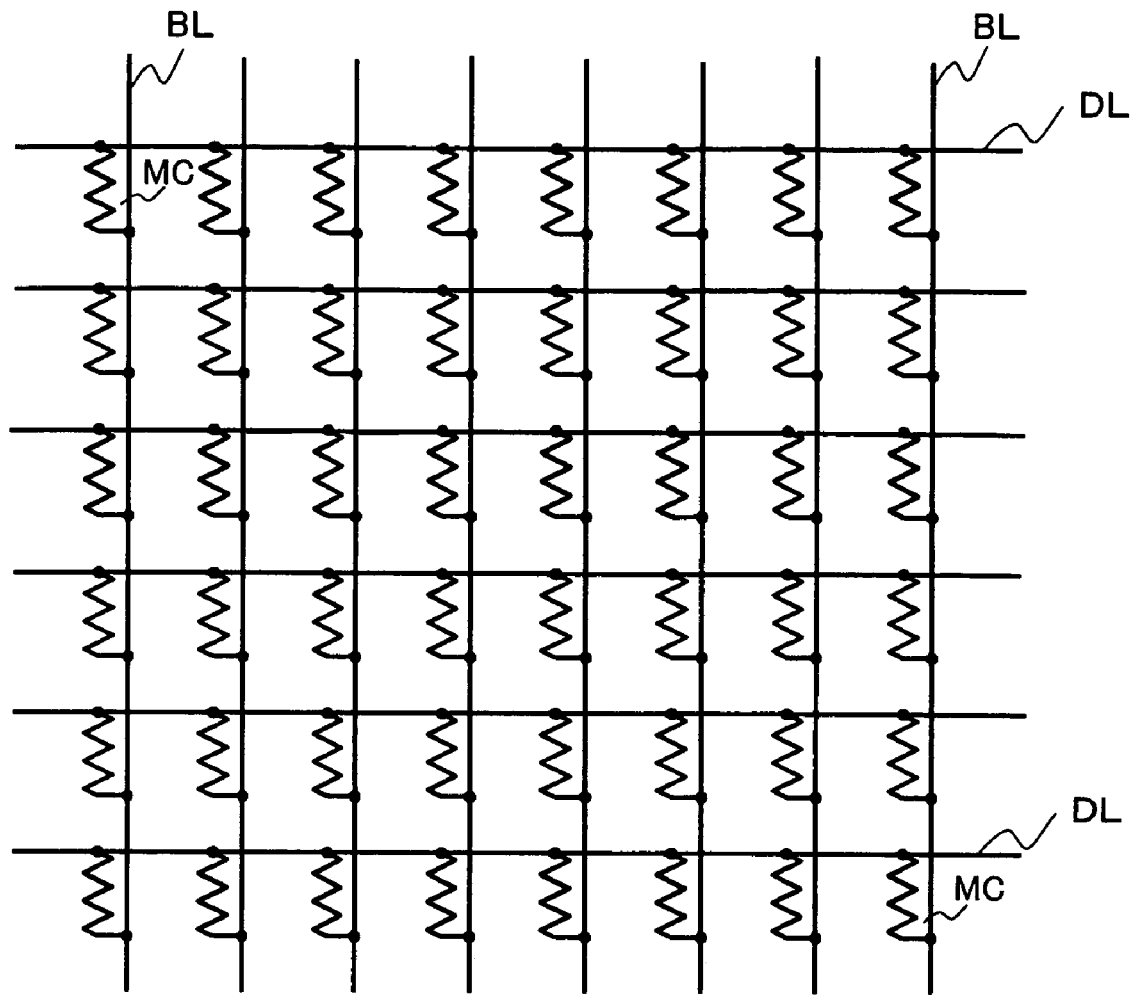
FIG. 2 is a circuit diagram schematically showing a circuit constitution of a crosspoint-type memory cell array according to one embodiment of the semiconductor memory device according to the present invention.

FIG. 1 shows a memory cell array constitution employing a bank structure comprising a plurality of memory cell arrays 10 and a block constitution of a main part regarding a readout operation of each memory cell array. Each memory cell array 10 has a crosspoint-type memory cell array structure illustrated in FIG. 2, in which memory cells MC each comprising variable resistive elements which store three or more multi-level information depending on a change in electric resistance are arranged in row direction and column direction in the shape of an array, a plurality of data lines (row selection line) DL extending in the row direction and a plurality of bit lines (column selection line) BL extending in the column direction are provided, respective one ends of the variable resistive elements of the memory cells MC in the same row are connected to the same data line DL and respective the other ends of the variable resistive elements of the memory cells MC are connected to the same bit line BL. For example, the memory cell array 10 is 16 rows×16 columns or 64 rows×64 columns in size, and in this case, each of the number of the data lines and the bit lines is sixteen. In addition, it is assumed that the multi-level information stored in the memory cell MC is 4-level (2-bit) information in the following description.

According to the bank structure of this embodiment, the memory cell arrays 10 are arranged in the row direction and the column direction in the shape of an array, respective data lines DL of the memory cell arrays 10 are connected to a common global data line GDL extending along the memory cell arrays in the row direction through array selection transistors 70 to select the memory cell array, and respective bit lines BL of the memory cell arrays 10 are connected to a common global bit line GBL extending along the memory cell arrays in the column direction through array selection transistors 71 to select the memory cell array. Therefore, each memory cell array 10 has a hierarchical data line and bit line structure. Here, although it is not shown, the odd-numbered global data lines GDL may be connected to the corresponding odd-numbered data lines DL counted from one side of each bank, and the even-numbered global data lines GDL may be connected to the corresponding even-numbered data lines DL counted from the other side of each bank. Similarly, the odd-numbered global bit lines GBL may be connected to the corresponding odd-numbered bit lines BL counted from one side of each bank, and the even-numbered global bit lines GBL may be connected to the corresponding even-numbered bit lines BL counted from the other side of each bank.

As shown in FIG. 1, the device of the present invention comprises a data line drive circuit 11 which drives each global data line GDL, a bit line drive circuit 12 which drives each global bit line GBL, a row decoder 13 which selects a data line connected to a memory cell to be read out from the plurality of data lines DL, and a column decoder 14 which selects a bit line connected to a memory cell to be read out from the plurality of bit lines BL for the memory cell array 10. More specifically, the row decoder 13 selects a global data line connected to the data line to be selected from the plurality of global data lines GDL through the array selection transistor 70 and the data line to be selected is selected by the array selection transistor 70. Similarly, the column decoder 14 selects a global bit line connected to the bit line to be selected from the plurality of global bit lines GBL through the array selection transistor 71 and the bit line to be selected is selected by the array selection transistor 71.

The device of the present invention further comprises three pairs of reference memory cell arrays 20a to 20f to generate a reference voltage, which has the same size and uses the same memory cell as that of the memory cell array 10, and three sense circuits 15 which generate reference voltage levels from the output voltages Vref0 and Vref1 of each pair of the reference memory cell arrays, generate a readout voltage level from a voltage level Vm of the selected global data line of the memory cell array 10, compare the readout voltage level with the reference voltage level, and determine a memory state (resistance state) of the selected memory cell. According to this embodiment, since each memory cell stores 4-level information, a range of a resistance value taken by the variable resistive element is divided into four resistance states (resistance value distribution range) corresponding to each memory level and set so that the resistance state of each memory level may not overlap with the other. Thus, the 4-level information is read out by using middle values (there are three) of four resistance states as reference levels (resistance values). Therefore, one reference level corresponds to one sense circuit 15.

Figure 3:
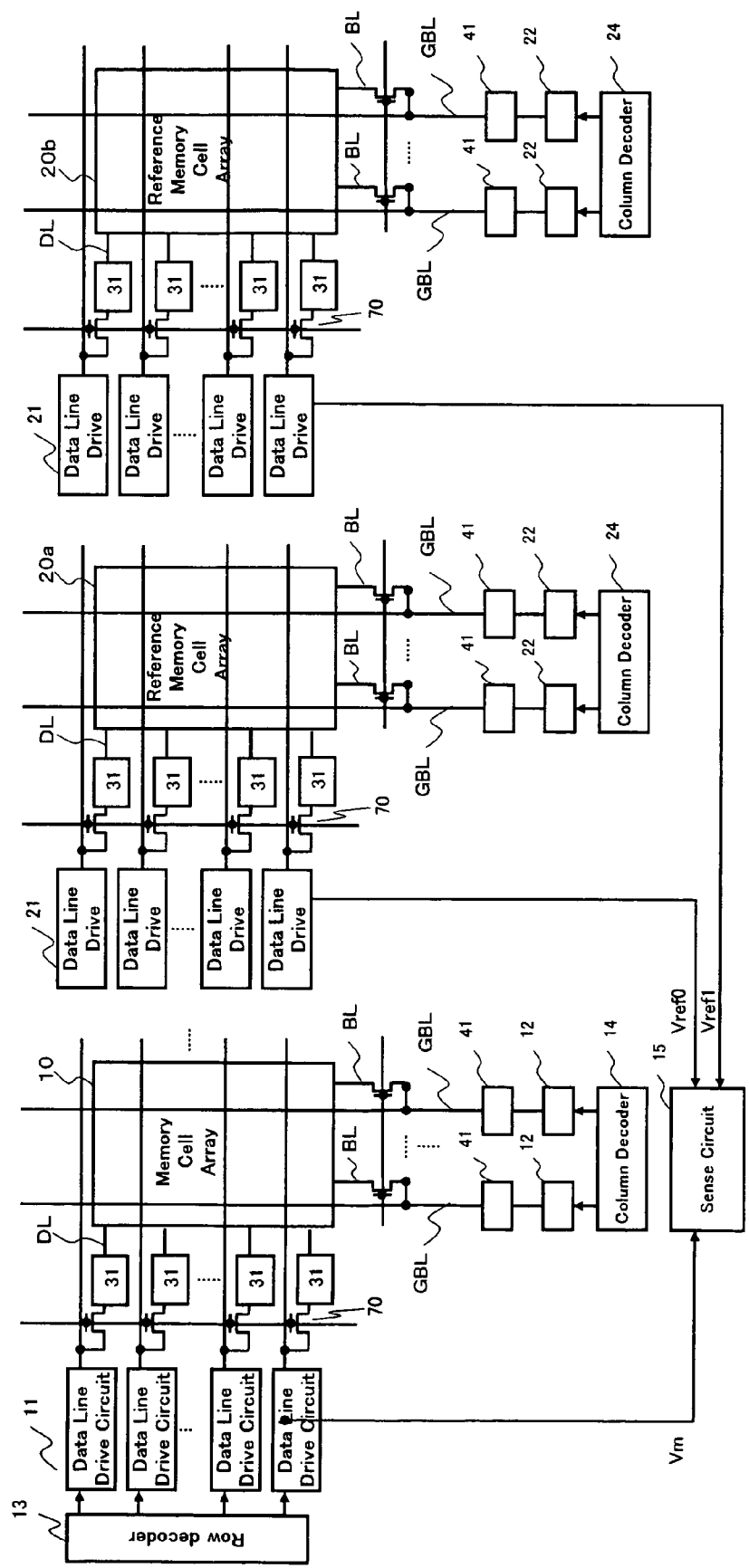
FIG. 3 is a circuit block diagram showing a constitution of the memory cell array and a reference memory cell array in a block constitution of the semiconductor memory device according to the present invention shown in FIG. 1.

As shown in FIG. 3, each of the reference memory cell arrays 20a to 20f comprises a data line drive circuit 21, a bit line drive circuit 22, and a column decoder 24 which are the same circuit constitution as that of the data line drive circuit 11, the bit line drive circuit 12 and the column decoder 14 provided for the memory cell array 10. A row voltage displacement prevention circuit 31 and a column voltage displacement prevention circuit 41 which will be described below are provided in the same manner.

As shown in FIG. 1, the device of the present invention employs the bank structure comprising the plurality of memory cell arrays 10. This is because although it is necessary to increase the array size of the memory cell array 10 in order to implement a large-capacity memory in a case of one memory cell array 10, according to the crosspoint-type memory cell array structure, since a readout margin deteriorates and readout cannot be performed as the array size is increased, a maximum tolerance size exists in the array size of the single memory cell array 10.

In addition, according to this embodiment, since six reference memory cell arrays having the same size as that of the memory cell array 10 are used, an overhead of an occupied area of the reference memory cell array can be reduced by increasing the number of the memory cell arrays 10. Therefore, it is not necessary to provide the reference memory cell arrays 20a to 20f for each bank (memory cell array), so that the overhead can be reduced by sharing the reference memory cell arrays 20a and 20f among the plurality of banks.

Figure 4:
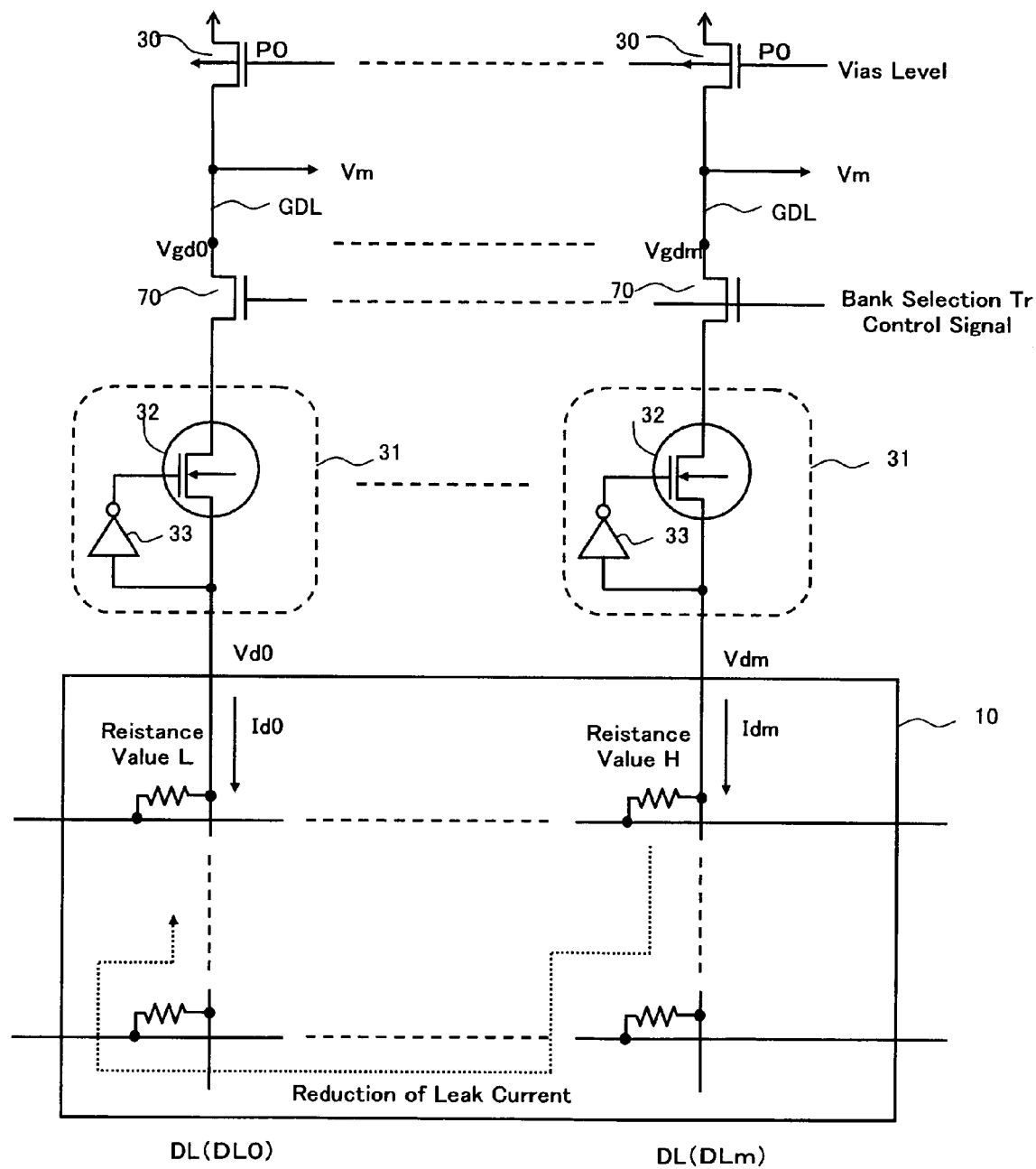
FIG. 4 is a circuit diagram showing one constitution example of a data line drive circuit, a row readout voltage supply circuit, and a row voltage displacement prevention circuit of the semiconductor memory device according to the present invention.

As shown in FIG. 4, the data line drive circuit 11 connected to each global data line GDL comprises a row readout voltage supply circuit 30 which supplies a second voltage (power supply voltage Vcc, for example) at the time of readout. More specifically, the row readout voltage supply circuit 30 comprises a PMOS in which a gate level is fixed to a predetermined bias level so as to operate in a saturation region, a source of the PMOS is connected to the above second voltage and a drain thereof is connected to an output node from which the voltage level Vm of the selected global data line is outputted. In addition, the row voltage displacement prevention circuit 31 which prevents the displacement of the voltage level supplied from the row readout voltage supply circuit 30 to the selected data line through the array selection transistor 70 is provided between the data line DL of each memory cell array 10 and the array selection transistor 70. The row voltage displacement prevention circuit 31 is provided with a feedback circuit part comprising an N channel MOSFET (referred to as the "NMOS" simply) 32 in which a source is connected to the data line DL and a drain is connected to the array selection transistor 70, and an inverter 33 which adjusts an ON resistance of the NMOS 32 by changing a gate voltage of the NMOS 32 depending on a voltage level Vd of the data line DL. The voltage level Vd supplied to the data line DL is a voltage provided by subtracting a voltage drop amount of the PMOS 30, the array selection transistor 70 and the NMOS 32 from the second voltage (power supply voltage Vcc, for example) as shown in FIG. 4. More specifically, it is adjusted by an inversion level of the inverter 33 of the row voltage displacement prevention circuit 31 and a threshold voltage of the NMOS 32.

Figure 5:
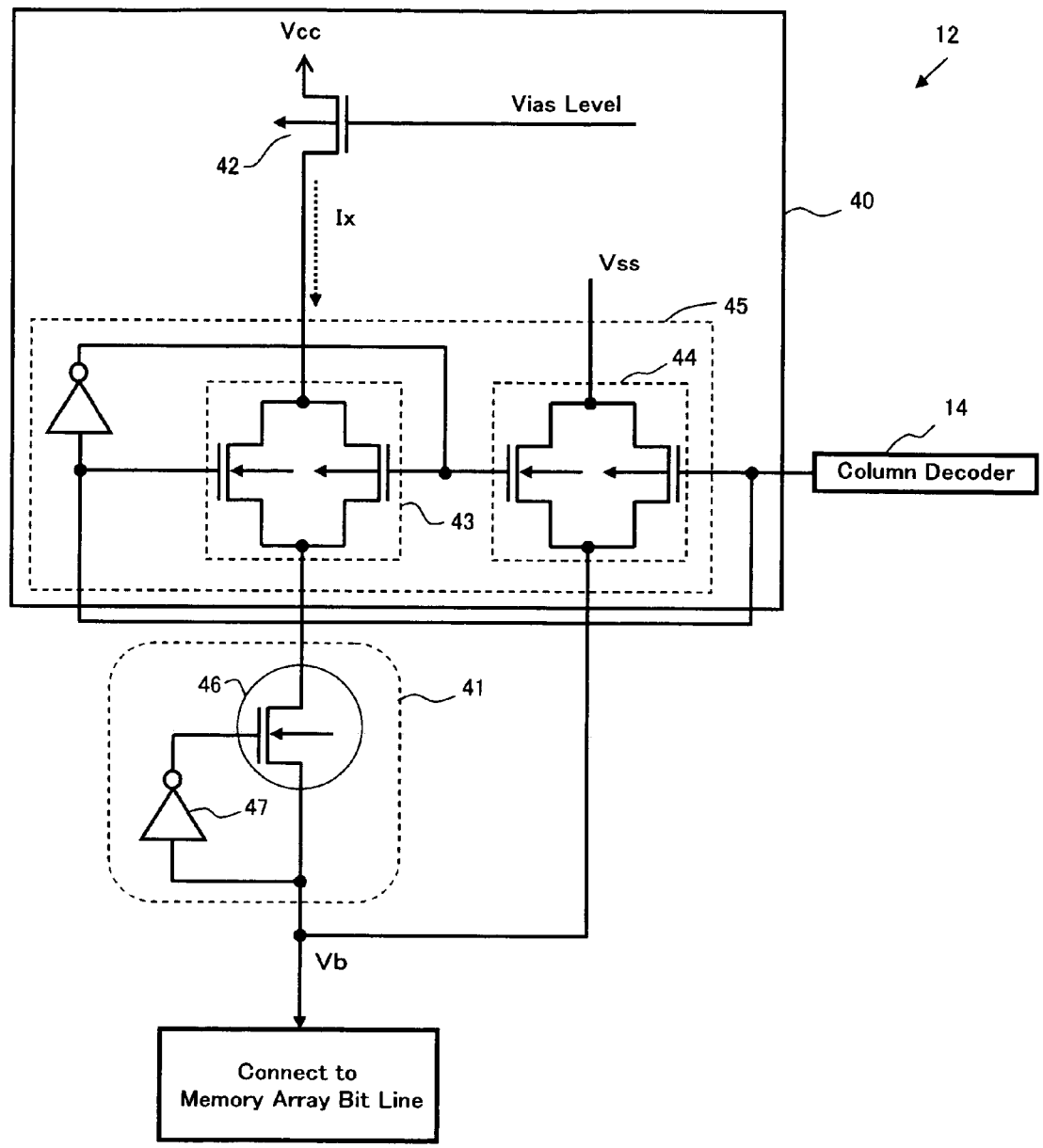
FIG. 5 is a circuit diagram showing one constitution example of a bit line drive circuit, a column readout voltage supply circuit, and a column voltage displacement prevention circuit of the semiconductor memory device according to the present invention.

As shown in FIG. 5, the bit line drive circuit 12 connected to each global bit line GBL comprises a column readout voltage supply circuit 40 which supplies a predetermined first voltage (ground voltage Vss, for example) when the readout is selected and supplies the second voltage (power supply voltage Vcc, for example) which is different from the first voltage when the readout is not selected, and a column voltage displacement prevention circuit 41 which prevents a displacement in voltage level supplied from the column readout voltage supply circuit 40. More specifically, the column readout voltage supply circuit 40 comprises a load circuit comprising a PMOS 42, and a column selection circuit 45 comprising two CMOS transfer gates 43 and 44. In the column selection circuit 45, the right CMOS transfer gate 44 is turned on to supply the first voltage to the bit line when the bit line is selected by the decode output of the column decoder 14, and the left CMOS transfer gate 43 is turned on to supply the second voltage through the PMOS 42, the CMOS transfer gate 43 and column voltage displacement prevention circuit 41 when the bit line is unselected. The PMOS 42 is set such that its source is connected to the power supply voltage Vcc, its drain is connected to one end of the CMOS transfer gate 43, and its gate is fixed to a predetermined bias level to operate in a saturation region. The other end of the CMOS transfer gate 43 is connected to the global bit line through the column voltage displacement prevention circuit 41. The one end of the CMOS transfer gate 44 is connected to the ground voltage Vss and the other end thereof is connected to the global bit line. The column voltage displacement prevention circuit 41 is provided with a feedback circuit part comprising an NMOS 46 in which a source is connected to the bit line and a drain is connected to the other end of the CMOS transfer gate 43, and an inverter 47 which adjusts an ON resistance of the NMOS 46 by changing a gate voltage of the NMOS 46 depending on a voltage level Vb of the bit line. The voltage level Vb supplied to the bit line is a voltage provided by subtracting a voltage drop amount of the PMOS 42, the CMOS transfer gate 43 and the NMOS 46 from the second voltage (power supply voltage Vcc, for example) as shown in FIG. 5 when the bit line is not selected. More specifically, it is adjusted by an inversion level of the inverter 47 of the column voltage displacement prevention circuit 41 and a threshold voltage of the NMOS 46. In addition, the second voltage supplied to the unselected global bit line is the same voltage level as the second voltage supplied to the global data line.

Figure 17:
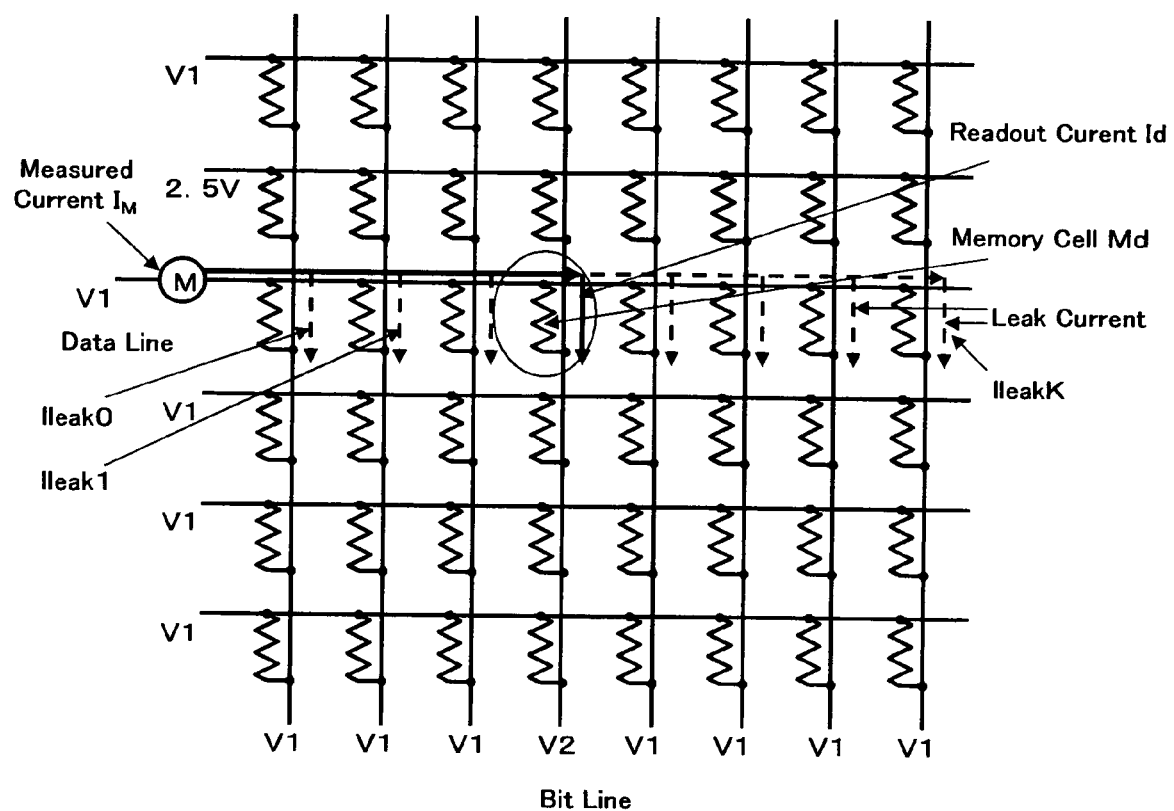
FIG. 17 is a circuit diagram showing current paths of leak currents generated when a readout current Id of a memory cell Md is measured in the memory cell array of the conventional crosspoint memory.
Figure 18:
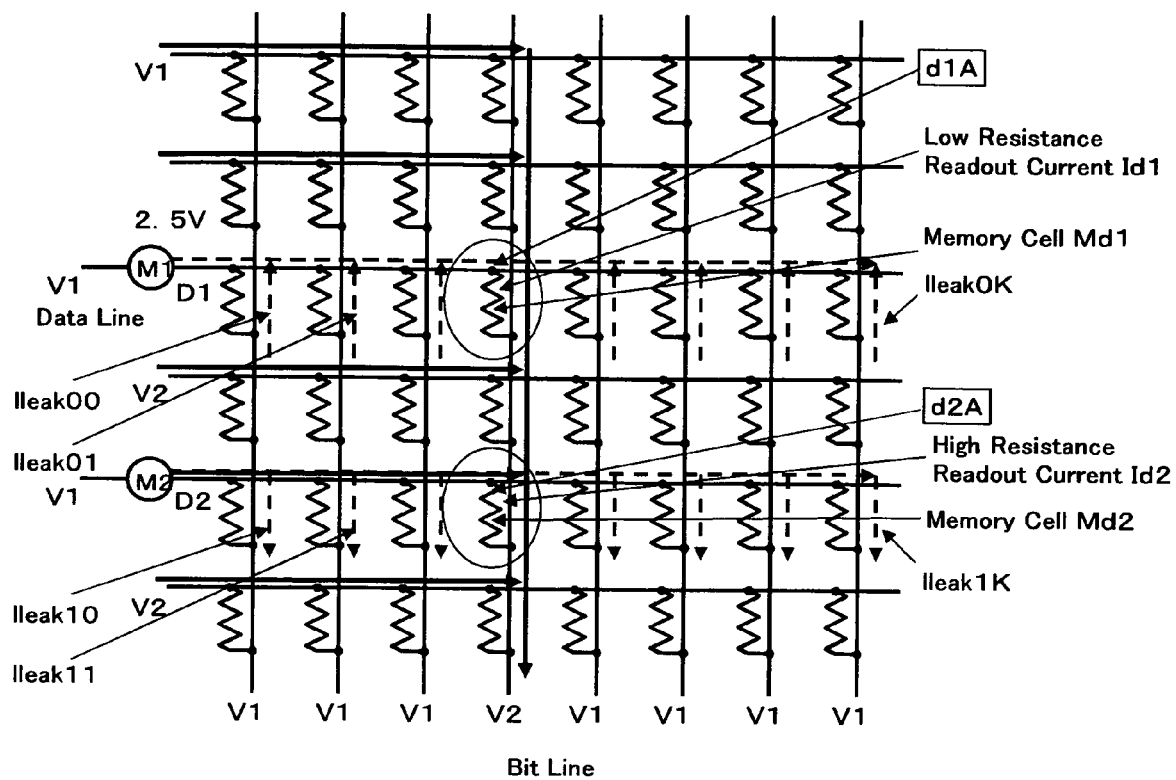
FIG. 18 is a circuit diagram showing current paths and direction of leak currents generated when a readout current Id1 of a memory cell Md1 is measured, and a direction of leak currents generated when a readout current Id2 of the memory cell Md2 is measured in the memory cell array of the conventional crosspoint memory.
Figure 19:
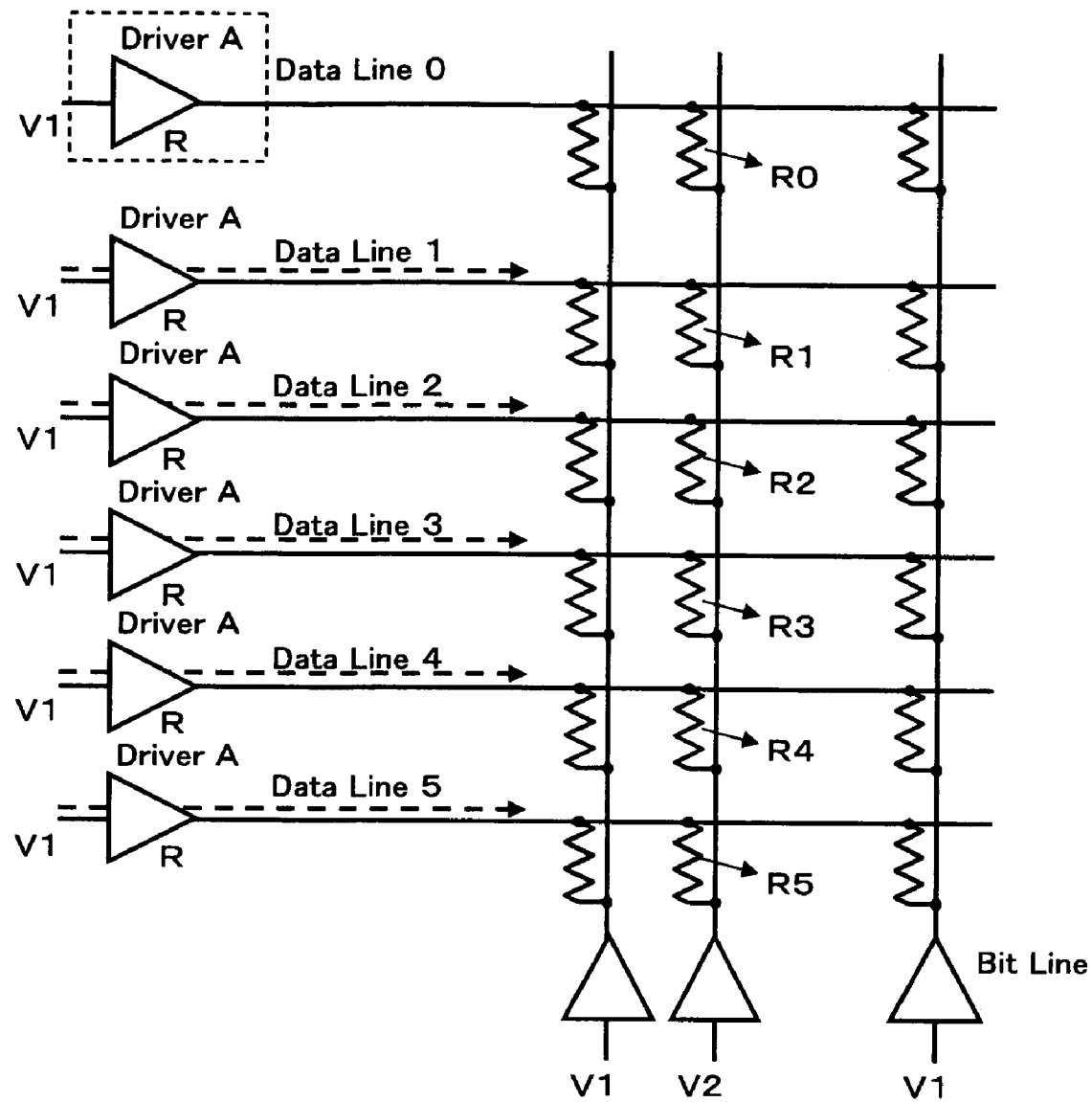
FIG. 19 is a view to explain a reason why the leak current is generated in the memory cell array of the conventional crosspoint memory.
Figure 20:
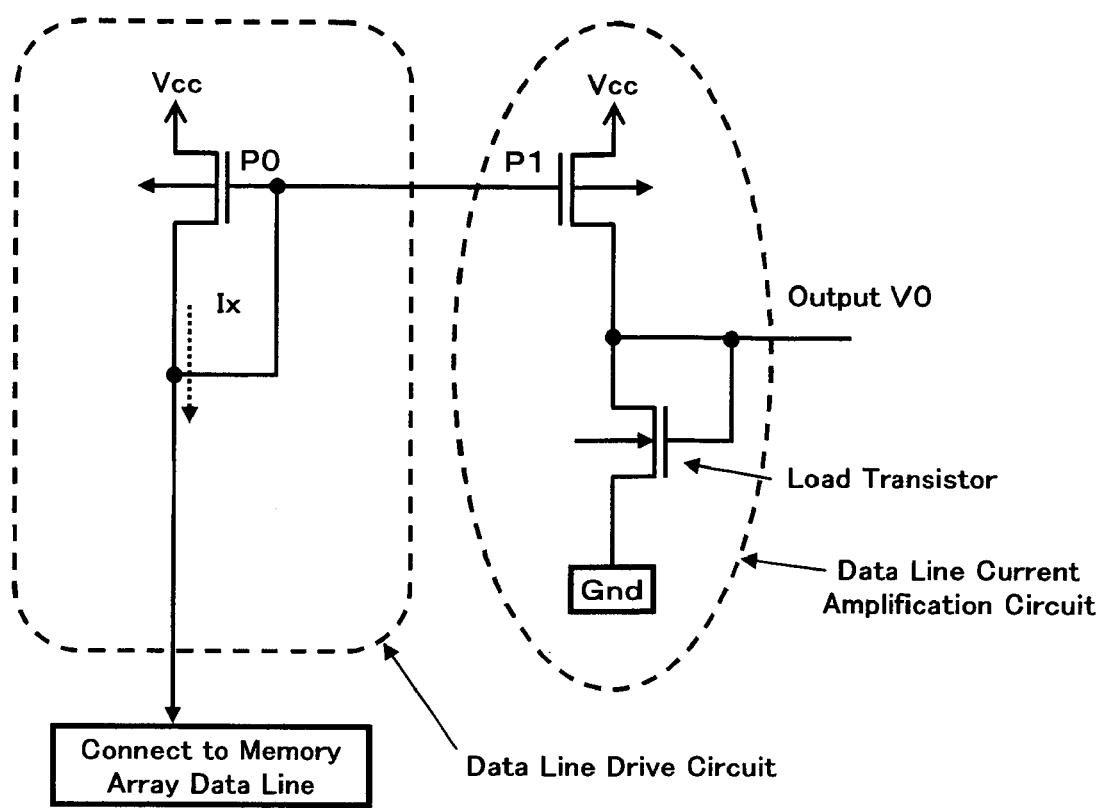
FIG. 20 is a circuit diagram showing an example of a circuit serving as a data line driver and an amplifier used in the memory cell array of the conventional crosspoint memory.
Figure 21:
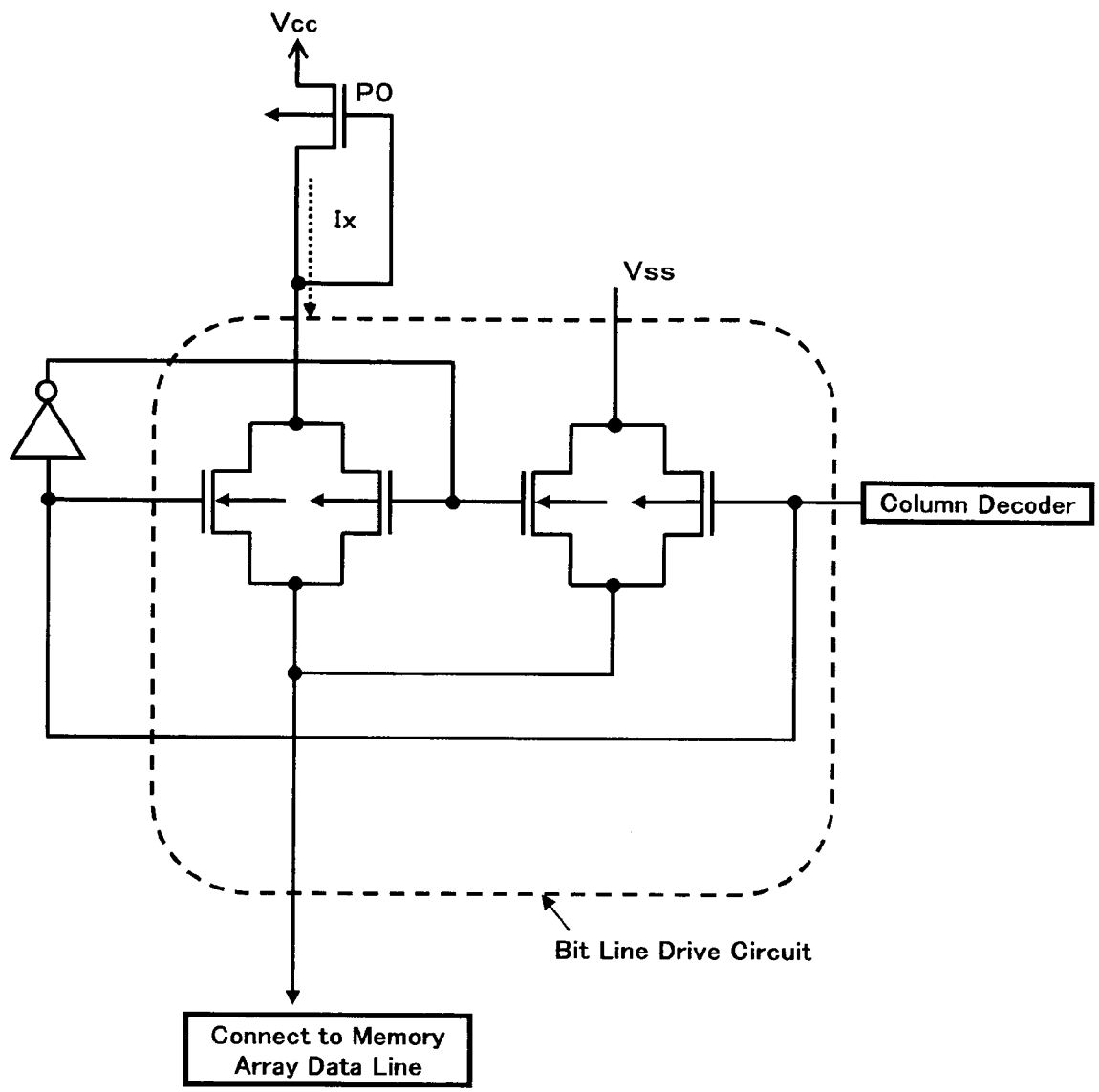
FIG. 21 is a circuit diagram showing an example of a bit line drive circuit used in the memory cell array of the conventional crosspoint memory.
Figure 22:
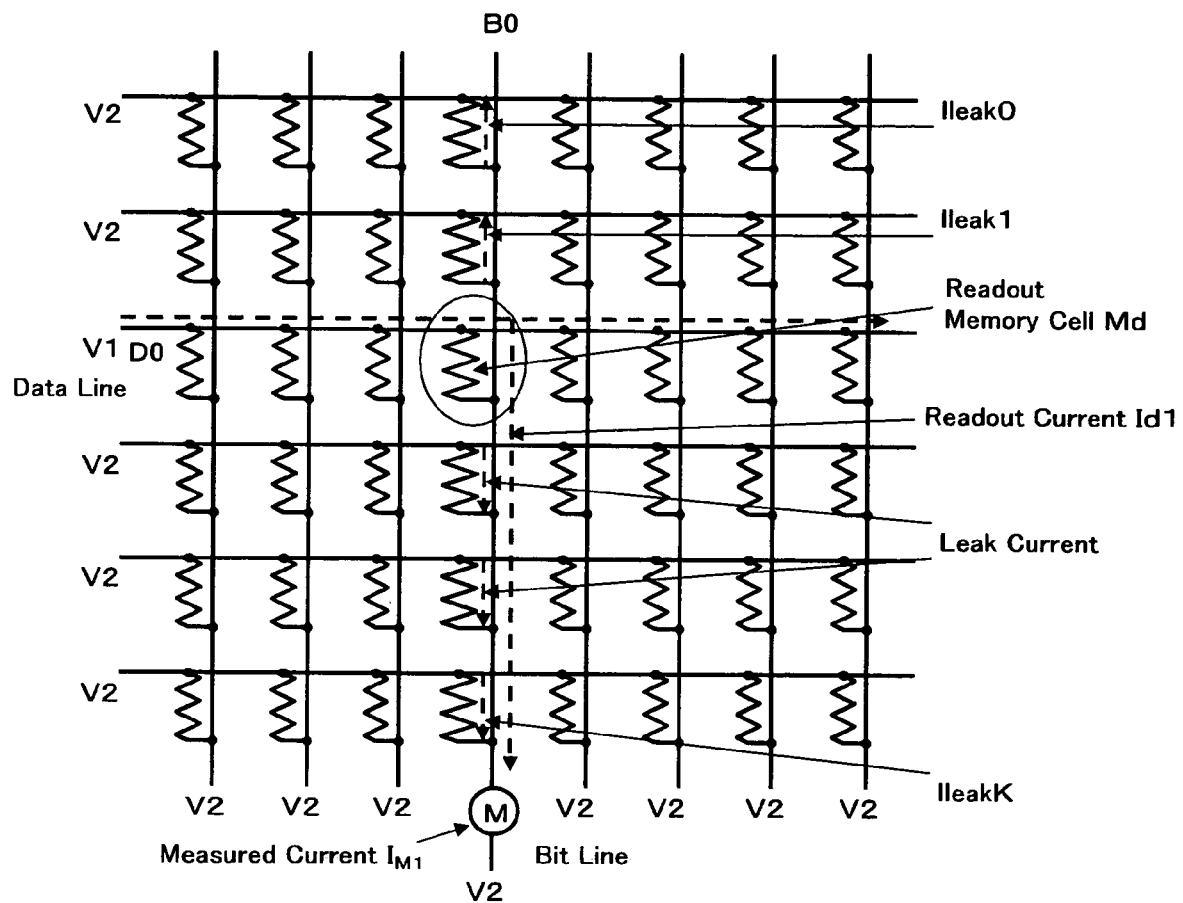
FIG. 22 is a circuit diagram showing each data line, voltage setting of each bit line and current paths when a memory cell in a high resistance state at an intersection of a data line D0 and a bit line B0 is read out in the memory cell array of the conventional crosspoint memory.
Figure 23:
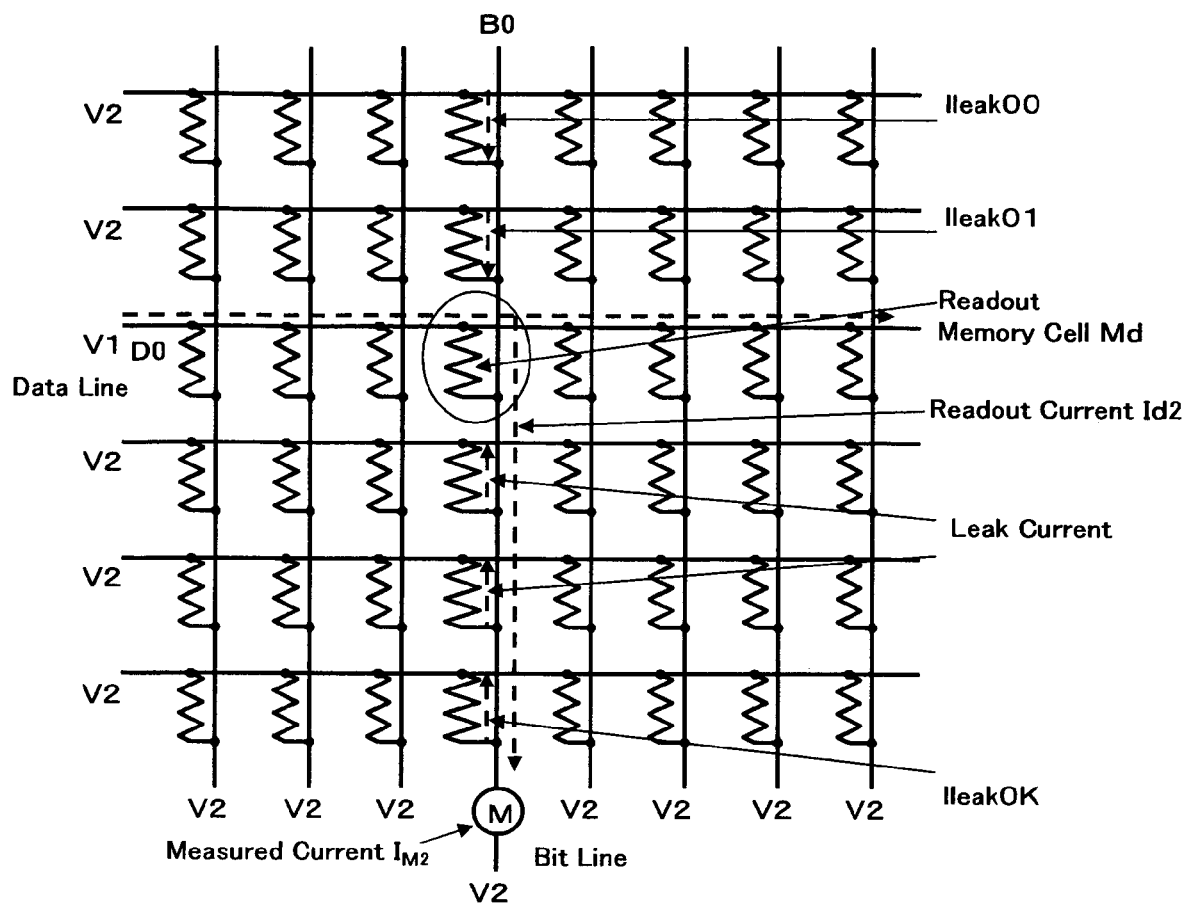
FIG. 23 is a circuit diagram showing each data line, voltage setting of each bit line and current paths when a memory cell in a low resistance state at the intersection of the data line D0 and the bit line B0 is read out in the memory cell array of the conventional crosspoint memory.
Figure 24:
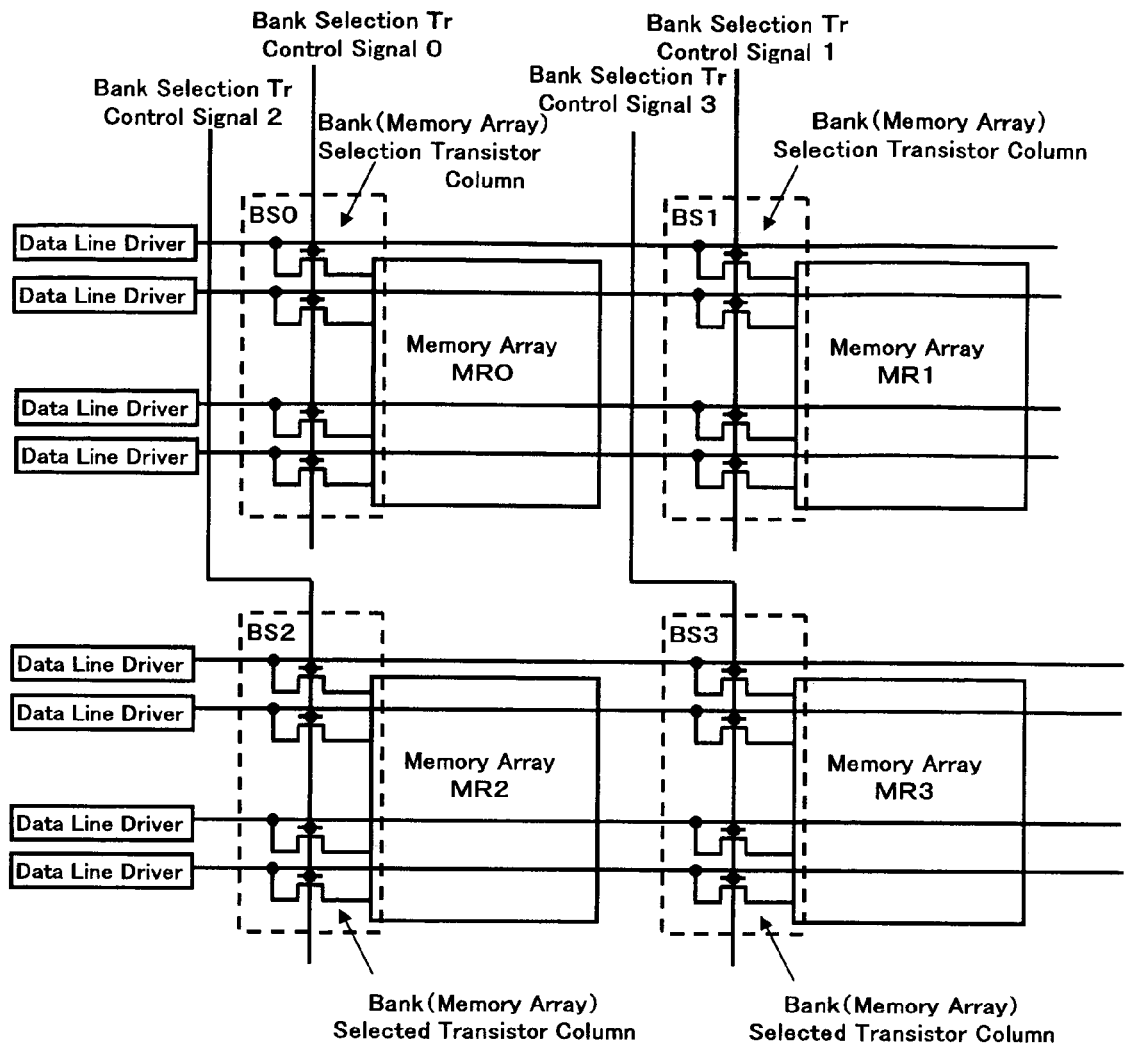
FIG. 24 is a circuit block diagram showing a memory cell array constitution which can select the memory cell array in bank.

The row voltage displacement prevention circuit 31 shown in FIG. 4 and the column voltage displacement prevention circuit 41 shown in FIG. 5 are provided to prevent fluctuation (refer to equations (2) and (3)) in current measured in the selected data line caused by a leak current (a sneak current through the unselected memory cell) described as a problem in the crosspoint-type memory cell array above with reference to FIGS. 17 and 18, to improve the readout margin.

An operation of the row voltage displacement prevention circuit 31 will be described with reference to FIG. 4. When the resistance value of the memory cell to be read out is high, a voltage of the selected data line is raised. When the voltage Vd of the selected data line is raised, an input level of the inverter 33 in the row voltage displacement prevention circuit 31 is raised and an output level of the inverter 31 is lowered. Therefore, when the output level of the inverter 31 is lowered, a voltage between the gate and the source of the NMOS 32 is lowered and the ON resistance of the NMOS 32 is lowered, so that a driving ability to the selected data line is lowered and a supply ability of the leak current is also lowered.

Meanwhile, when the resistance value of the selected memory cell is low, since the voltage of the selected data line becomes lower than the voltage of the data line connected to another memory cell having a high resistance value, a sneak current (leak current) from the high voltage level (unselected data line) to the selected data line of the low voltage level is generated. When the voltage of the selected data line is lowered, the input level of the inverter 33 in the row voltage displacement prevention circuit 31 is lowered and the output level of the inverter 33 is raised. Therefore, when the output level of the inverter 33 is raised, the voltage between the gate and the source of the NMOS 32 is raised, and the ON resistance of the NNOS 32 is increased. Thus, since the driving ability to the selected data line is increased, the current supply ability to the selected data line is increased, so that the leak current to the unselected data line is substantially reduced.

As the size of the memory cell array is increased, the leak current (sneak current) is increased regardless of the height of the resistance value of the selected memory cell. Therefore, a leak current reducing effect of the row voltage displacement prevention circuit 31 becomes prominent in a large memory cell array in which the leak current is likely to be generated.

Figure 6:
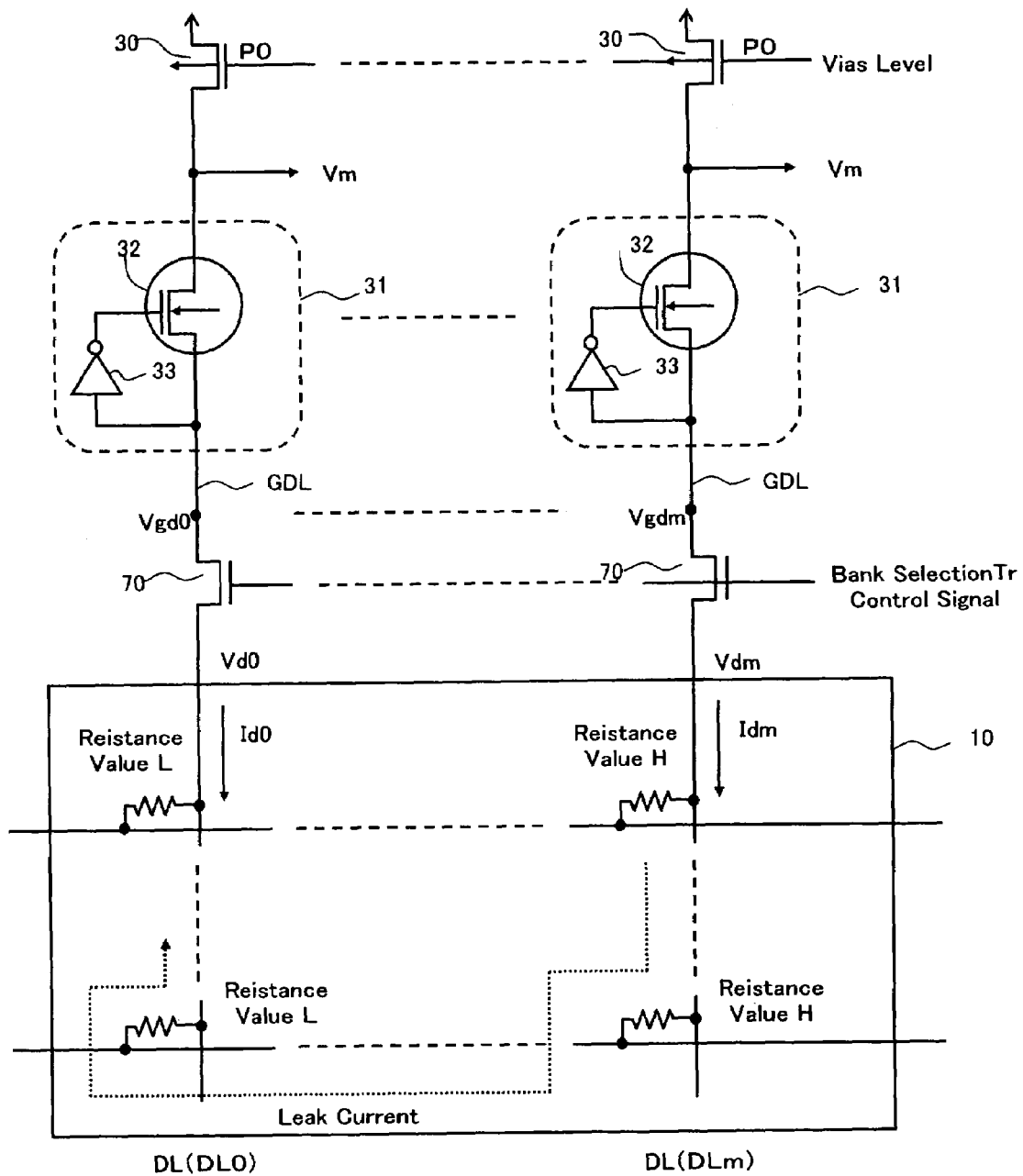
FIG. 6 is a circuit diagram showing another constitution example of the data line drive circuit in a memory cell array constitution in which a plurality of memory cell arrays can be selected by the bank.

As shown in FIG. 4, according to this embodiment, the row readout voltage supply circuit 30 of the data line drive circuit 11 is provided on the side of the global data line GDL, and the row voltage displacement prevention circuit 31 is provided on the side of the data line DL, so that both are separated by the array selection transistor 70. Meanwhile, when the row readout voltage supply circuit 30 and the row voltage displacement prevention circuit 31 are not separated, the row voltage displacement prevention circuit 31 is positioned between the row readout voltage supply circuit 30 and the global data line GDL as shown in FIG. 6. In this case, when one resistance value of the variable resistive element connected to the data lines DL0 and DLm and the selected bit line BL is high and the other thereof is low, there is a difference generated between the currents Id0 and Idm flowing in the data lines DL0 and DLm. Here, although a large voltage difference is not generated between the voltages Vdg0 and Vdgm of the global data line GDL because of a voltage displacement preventing effect of the row voltage displacement prevention circuit 31, a voltage difference is generated between the voltages Vd0 and Vdm in the data lines DL0 and DLm. According to this voltage difference, the difference between the currents Id0 and Idm flowing in the array selection transistor 70 is generated by a difference of voltage drop between the source and the drain of the array selection transistor 70. That is, since a current (Id0 in the example shown in FIG. 6) on the side of the variable resistive element having the lower resistance value is high, the voltage drop of the array selection transistor 70 on the side of the data line DL0 is increased and it becomes that Vd0<Vdm. As a result, the sneak current from the data line DLm to the data line DL0 is generated. That is, the voltage displacement controlling effect of the row voltage displacement prevention circuit 31 is lowered because of the array selection transistor 70. However, as shown in FIG. 4, when the row voltage displacement prevention circuit 31 is inserted between the array selection transistor 70 and the data line DL, since the voltage displacement of the voltages Vd0 and Vdm of the data lines DL0 and DLm are directly prevented by the voltage displacement control effect of the row voltage displacement prevention circuit 31, the voltage difference (Vdm−Vd0) between the data lines DL0 and DLm becomes small as compared with the constitution shown in FIG. 6, so that the sneak current caused by the voltage difference between the data lines DL0 and DLm is prevented.

An operation of the column voltage displacement prevention circuit 41 will be described with reference to FIG. 5. When the voltage of the unselected bit line is higher than the voltage of the data line and other unselected bit line, the column voltage displacement prevention circuit 41 lowers the voltage level of the unselected bit line and when the voltage of the unselected bit line is lower than the voltage of the data line and other unselected bit line, it functions to raise the level of the unselected bit line. As its operation principle is the same as that of the row voltage displacement prevention circuit 31, an overlapping description will be omitted. However, according to this embodiment, since the column readout voltage supply circuit 40 and the column voltage displacement prevention circuit 41 are integrated so that they cannot be separated, the column voltage displacement prevention circuit 41 is provided on the global bit line GBL. Therefore, its voltage displacement prevention effect is lower than that of the row voltage displacement prevention circuit 31. If the lowering of the voltage displacement prevention effect of the column voltage displacement prevention circuit 41 is to be prevented like the row voltage displacement prevention circuit 31, for example, the bit line drive circuit 12 may be provided every bank, or the circuit constitution of the bit line drive circuit 12 may be changed so as to adapt to the hierarchical bit line structure. When the bit line drive circuit fit in the hierarchical bit line structure is used, the column voltage displacement prevention circuit 41 can be directly connected to the bit line of the bank.

Then, a description will be made of a relation between a voltage level Vm of the selected data line outputted to the output node, that is, a drain voltage of the PMOS forming the row readout voltage supply circuit 30 and a current flowing in the selected data line measured at the output node, that is, a drain current of the PMOS in the row readout voltage supply circuit 30.

Figure 7:
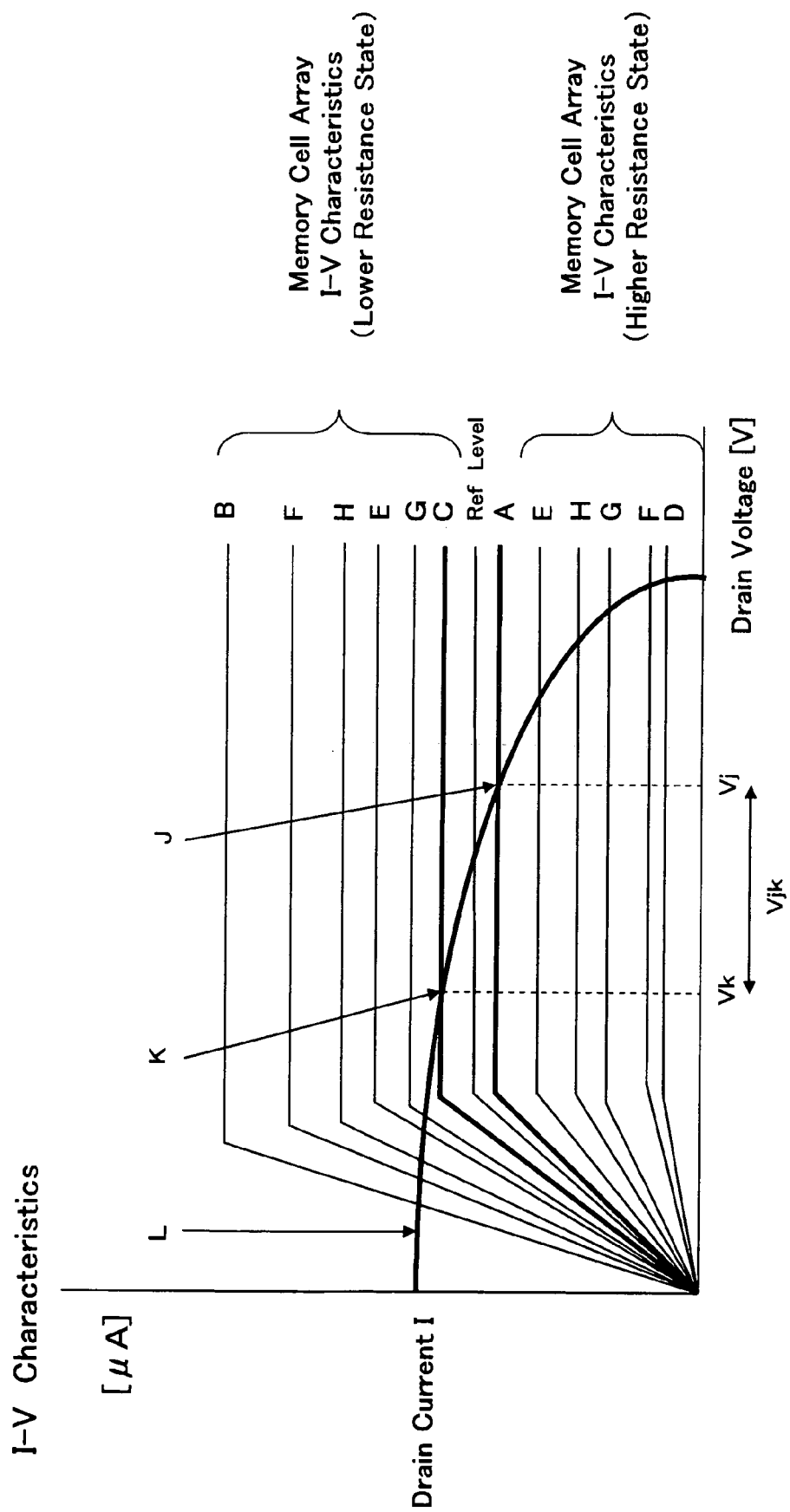
FIG. 7 is a static characteristic view showing load characteristics in which a PMOS operating in a saturation region is a load resistance, I-V characteristics of the memory cell array in various distribution patterns of resistance states of the memory cells in the memory cell array, and output voltage of the row readout voltage supply circuit.

FIG. 7 shows load characteristics (I-V characteristics shown by "L" in the drawing) in which the PMOS operating in the saturation region is a load resistance, and I-V characteristics (shown by "A" to "H" in the drawing) of the memory cell array in various distribution patterns (A to H) of the resistance states of the memory cell in the memory cell array. The distribution patterns will be described below. In FIG. 7, an intersection of the load characteristics L and the I-V characteristics of the memory cell array is an operation point. In addition, it is assumed that the memory cell stores 2-level data in FIGS. 7 to 11 to simplify the description.

Figure 8:
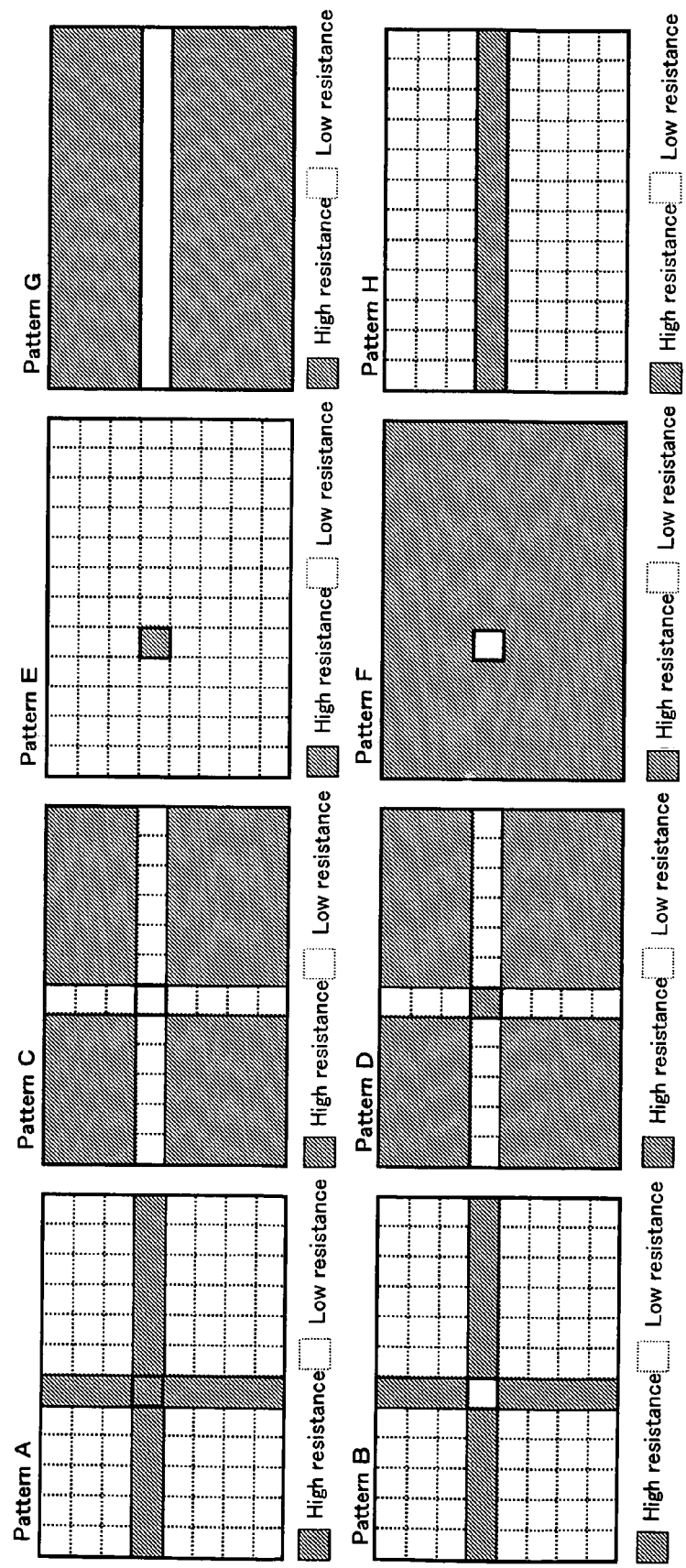
FIG. 8 are views to explain the various distribution patterns of the resistance states of the memory cells when 2-level data is stored in the crosspoint-type memory cell array.

The various kinds of distribution patterns (A to H) of the resistance states of the memory cell in the memory cell array will be described with reference to FIG. 8. Although a simple array size of 8 rows×12 columns is shown in FIG. 8 in order to simply describe the characteristics of the distribution patterns, this array size is not always an actual array size. In addition, in FIG. 8, a shaded region (dark part) shows a region in which the high resistance memory cell is distributed.

In FIG. 8, the pattern A shows that high resistance memory cells are distributed in one row and in one column and low resistance memory cells are distributed in a remaining region. When the resistance of the selected memory cell is high, if the high resistance memory cell positioned at the intersection of the row and column comprising the high resistance memory cells is read out, the sneak current becomes largest and the readout current becomes largest. When the resistance of the selected memory cell is low, any one of the low resistance memory cell is selected from the above remaining region.

The pattern B shows that high resistance memory cells are distributed in one row and in one column and low resistance memory cells are distributed in a remaining region and at an intersection of the row and column comprising the high resistance memory cells. When the resistance of the selected memory cell is high, any one of high resistance memory cells is selected. When the resistance of the selected memory cell is low, the low resistance memory cell positioned at the intersection of the row and column comprising the high resistance memory cell is read out, the sneak current becomes largest and the low resistance readout current becomes largest.

The pattern C shows that low resistance memory cells are distributed in one row and in one column and high resistance memory cells are distributed in a remaining region. When the resistance of the selected memory cell is high, any one of high resistance memory cells is selected. When the resistance of the selected memory cell is low, if the low resistance memory cell positioned at the intersection of the row and column comprising the low resistance memory cells is read out, the readout current becomes smallest.

The pattern D shows that low resistance memory cells are distributed in one row and in one column and high resistance memory cells are distributed in a remaining region and at an intersection of the row and column comprising the low resistance memory cells. When the resistance of the selected memory cell is high, if the high resistance memory cell positioned at the intersection of the row and column comprising the low resistance memory cells is read out, the sneak current becomes largest and the high resistance readout current becomes smallest. When the resistance of the selected memory cell is low, any one of low resistance memory cells may be selected.

The pattern E shows that only one is a high resistance memory cell and the other cells are low resistance memory cells. When the resistance of the selected memory cell is high, the one high resistance memory cell is selected. When the resistance of the selected memory cell is low, any one of the other low resistance memory cells may be selected.

The pattern F shows that only one is a low resistance memory cell and the other cells are high resistance memory cells. When the resistance of the selected memory cell is low, the one low resistance memory cell is selected. When the resistance of the selected memory cell is high, any one of the other high resistance memory cells is selected. That is, the pattern F is a reversed pattern of the pattern E.

The pattern G shows that only one row connected to one data line comprises the low resistance memory cells and the other rows comprises the high resistance memory cells. When the resistance of the selected memory cell is low, any one is selected from the low resistance memory cells in the one row. When the resistance of the selected memory cell is high, any one is selected from the high resistance memory cells in the other rows.

The pattern H shows that only one row connected to one data line comprises the high resistance memory cells and the other rows comprises the low resistance memory cells. When the resistance of the selected memory cell is high, any one is selected from the high resistance memory cells in the one row. When the resistance of the selected memory cell is low, any one is selected from the low resistance memory cells in the other rows. That is, the pattern H is a reversed pattern of the pattern G.

Circuit simulation is performed to above each pattern. As a result, as shown in FIG. 7, in the case where the selected memory cell is in the high resistance state, when the distribution pattern of the resistance state of other unselected memory cells is the pattern A, if the memory cell at the intersection of the row and column in the high resistance state is read out, the readout current in the high resistance state becomes largest, which is the worst case. In addition, in the case where the selected memory cell is in the low resistance state, when the distribution pattern of the resistance state of other unselected memory cells is the pattern C, if the memory cell at the intersection of the row and column in the low resistance state is read out, the readout current in the low resistance state becomes smallest, which is the worst case.

In addition, as a factor affecting the readout current, there is location dependence in the memory cell array other than the above distribution pattern dependence.

Figure 9A:
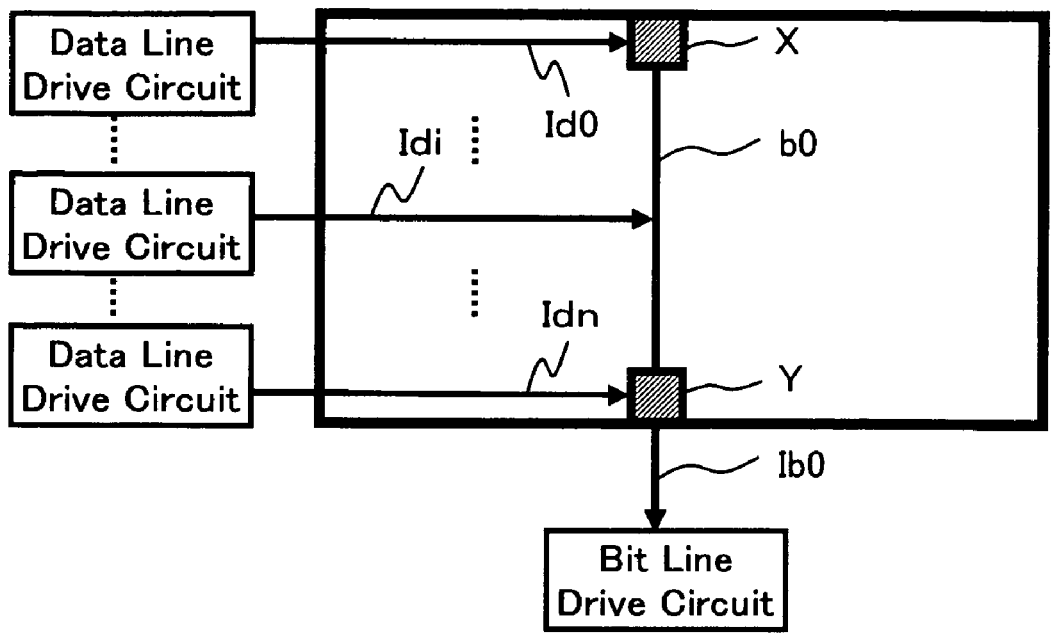
FIG. 9A is a view to explain location dependence of the memory cells in the memory cell array as a factor affecting a readout current of the memory cell, and showing current paths when each of the two different memory cells connected to the same bit line is read.

FIG. 9A shows current paths when a high resistance memory cell (X) which is the farthest from the bit line drive circuit connected to one bit line and a high resistance memory cell (Y) which is the nearest from the bit line drive circuit connected to one bit line are read out. This readout current is driven by data line currents Id0 to Idn and flows from the data line drive circuit into the selected bit line b0. That is, the current Ib0 flowing in the selected bit line b0 is the total of the current flowing in the all of the data lines as shown in the following equation (6).

$$Ib0 = \Sigma_{i=0 \ to \ n} Idi \quad (6)$$

Therefore, a potential at the memory cell X in the selected bit line b0 is different from a potential at the memory cell Y therein because an influence of the voltage drop along the bit line because of the bit line current Ib0.

Figure 9B:
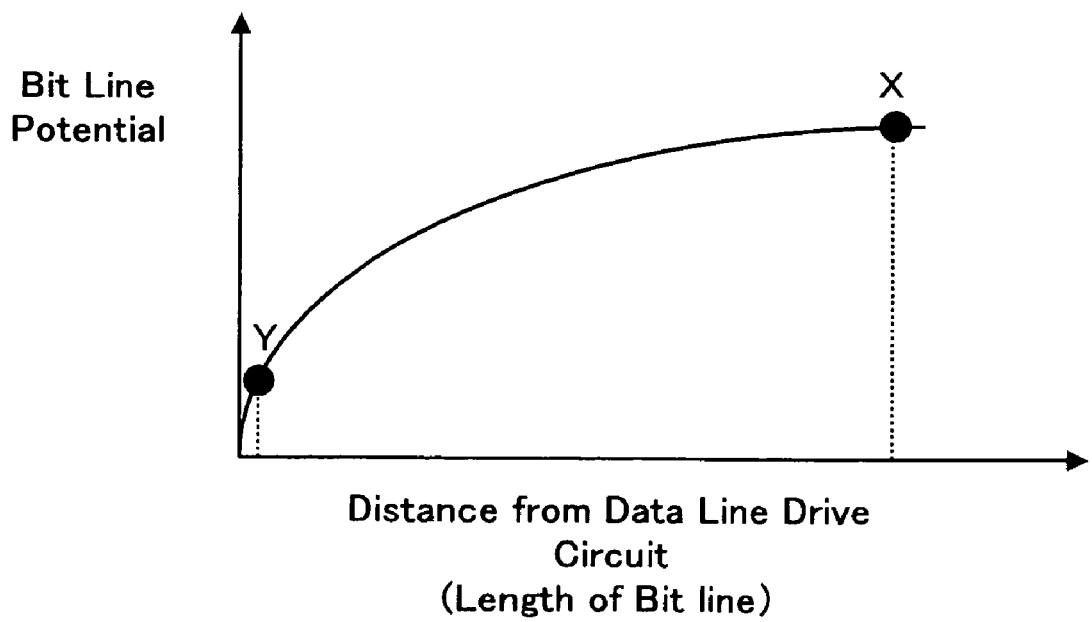
FIG. 9B is a view to explain location dependence of the memory cells in the memory cell array as a factor affecting the readout current of the memory cell, and schematically showing a relation between a position of the selected memory cell on the bit line and a bit line potential.

FIG. 9B shows a relation between a bit line length and a bit line potential. As shown in FIG. 9B, when the memory cell Y which is the closest to the bit line drive circuit is selected, the bit line potential is low and the memory cell X which is the farthest from the bit line drive circuit is selected, the bit line potential is high. Therefore, the readout current when the high resistance memory cell X is selected is smaller than that when the high resistance memory cell Y is selected. In view of this location dependence, the readout current when the memory cell "a" is selected in the pattern A shown in FIG. 10A becomes largest as compared with the readout current when the memory cell "a" is selected in the other pattern A shown in FIG. 10B. Similarly, the readout current when the memory cell "b" is selected in the pattern B shown in FIG. 10A becomes largest as compared with the readout current when the memory cell "b" is selected in the other pattern B shown in FIG. 10B. Similarly, the readout current when the memory cell "c" is selected in the pattern C shown in FIG. 10A becomes smallest as compared with the readout current when the memory cell "c" is selected in the other pattern C shown in FIG. 10B. Similarly, the readout current when the memory cell "d" is selected in the pattern D shown in FIG. 10A becomes smallest as compared with the readout current when the memory cell "d" is selected in the other pattern D shown in FIG. 10B.

In the circuit simulation result for the above each pattern shown in FIG. 7, it is assumed that a voltage level at an intersection J of the load characteristics L and the I-V characteristics of the memory cell array (pattern A) when the selected memory cell is in the high resistance state is Vj. In addition, it is assumed that a voltage level at an intersection K of the load characteristics L and the I-V characteristics of the memory cell array (pattern C or H) when the selected memory cell is in the low resistance state is Vk. In addition, it is assumed that a voltage difference between the intersections J and K is Vjk. The voltage difference Vjk shows the readout margin voltage when the selected memory cell is in the high resistance state and the low resistance state.

Meanwhile, a case where the PMOS constituting the row readout voltage supply circuit 30 operates not in the saturation region but in the linear region will be described with reference to FIG. 11. In this case, the gate of the PMOS of the load resistance is not connected to the predetermined bias level but connected to the drain. It is assumed that a voltage level at an intersection M of the load characteristics L' and the I-V characteristics of the memory cell array (pattern A) when the selected memory cell is in the high resistance state is Vm. In addition, it is assumed that a voltage level at an intersection N of the load characteristics L' and the I-V characteristics of the memory cell (pattern C or H) when the selected memory cell is in the low resistance state is Vn. In addition, it is assumed that a voltage difference between the intersections M and N is Vmn. The voltage difference Vmn shows the readout margin voltage when the selected memory cell is in the high resistance state and the low resistance state.

Figure 11:
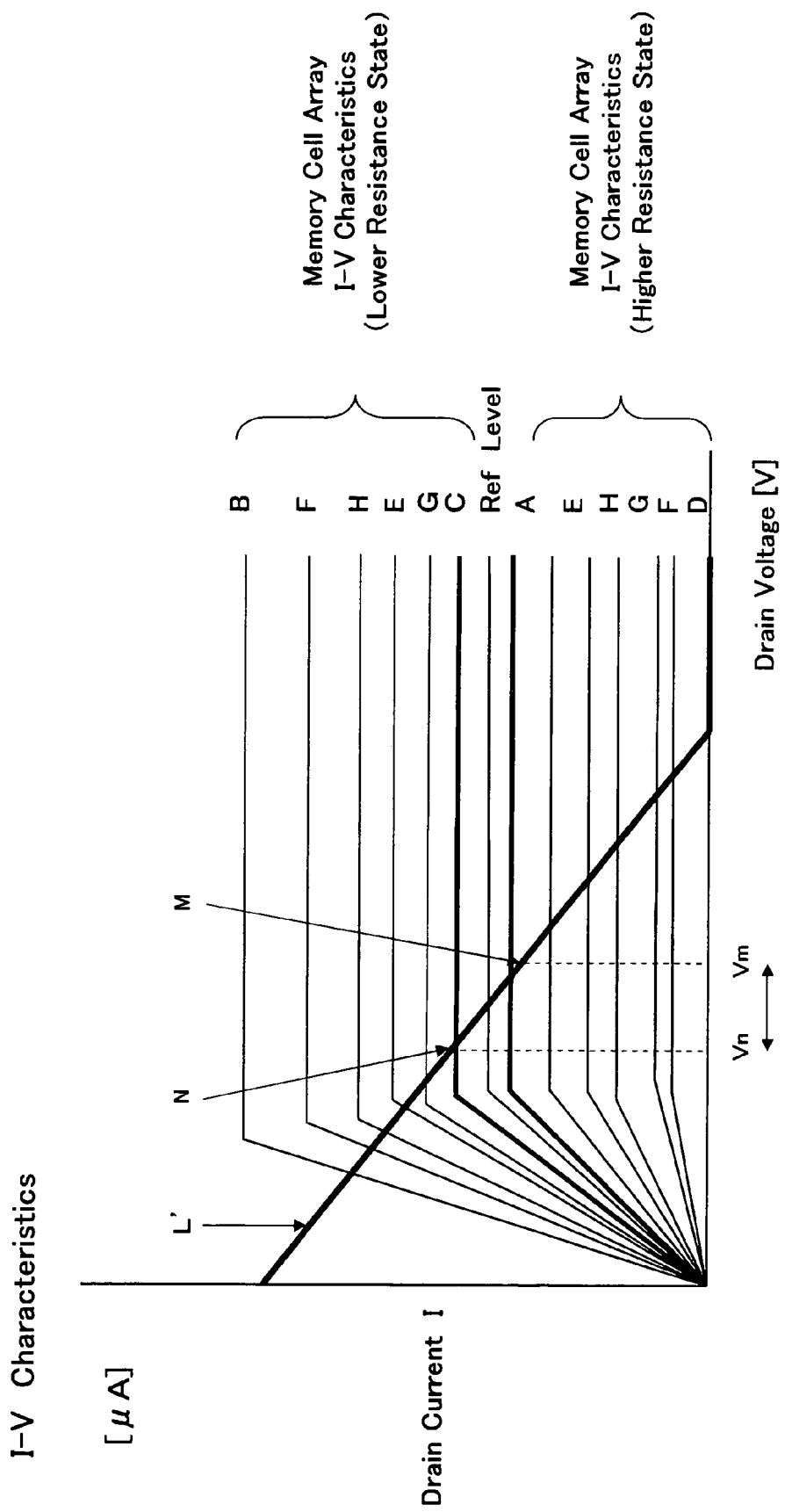
FIG. 11 is a static characteristic view showing load characteristics in which a PMOS operating in a linear region is a load resistance, I-V characteristics of the memory cell array in various distribution patterns of the resistance states of the memory cells in the memory cell array, and an output voltage of the row readout voltage supply circuit.

As can be seen from FIGS. 7 and 11, the voltage difference Vjk between intersections J and K with the load characteristics L operating in the saturation region is larger than the voltage difference Vnm between intersections M and N with the load characteristics L' operating in the linear region (as a resistance element), that is, Vjk>Vnm. Therefore, in view of this result, larger readout margin can be provided by operating the gate voltages of the PMOS of the row readout voltage supply circuit 30 and the column readout voltage supply circuit 40 in the saturation region at the predetermined bias level (middle level).

Next, the case where the memory cell stores the 4-level data will be described. Here, it is assumed that the memory levels of the 4-level data are (0,0), (0,1), (1,0), (1,1), standard values Rci (i=0 to 3) of the resistance values of the variable resistive element corresponding to the memory levels are RC0=50 kΩ, RC1=110 kΩ, RC2=200 kΩ, and RC3=180 kΩ.

The above description in the case the memory cell stores the 2-level data (FIGS. 7 to 11) basically corresponds to the case the memory cell stores the 4-level data. However, since the memory level is four, various diffusion patterns (A to H) of the resistance states of the memory cell in the memory cell array shown in FIG. 8 are further segmentalized, that is, the 12 diffusion patterns are provided. Among them, 6 patterns are for the case the resistance value of the selected memory cell is high and the other 6 patterns are for the case the resistance value of the selected memory cell is low. The patterns A to H when the resistance value of the selected memory cell is high are designated by patterns $A_H$ to $H_H$, and the patterns A to H when the resistance value of the selected memory cell is low are designated by patterns $A_L$ to $H_L$. In addition, in the patterns $A_H$ to $H_H$ when the resistance value of the selected memory cell is high, there are a plurality of resistance values of other low resistance memory cell, corresponding to the resistance values of the selected memory cell. That is, there are three resistance values RC1, RC2 and RC3 when the resistance value of the selected memory cell is high, and resistance values of the other low resistance memory cell corresponding to them are RC0 for RC1, RC0 and RC1 for RC2, and RC0, RC1 and RC2 for RC3, so that there are six resistance values in total. Similarly, in the patterns $A_L$ to $H_L$ when the resistance value of the selected memory cell is low, there are a plurality of resistance values of other low resistance memory cell, corresponding to the resistance values of the selected memory cell. That is, there are three resistance values RC0, RC1 and RC2 when the resistance value of the selected memory cell is low, and the resistance values of the other low resistance memory cell corresponding to them are RC1, RC2 and RC3 for RC0, RC2 and RC3 for RC1, and RC3 for RC2, so that there are six resistance values in total. Here, since the sneak current becomes high as a difference in resistance values between the low resistance memory cell and the high resistance memory cell becomes large in the distribution patterns $A_H$ to $H_H$ and $A_L$ to $H_L$, there is one worst case pattern for each of the distribution patterns $A_H$ to $H_H$ and $A_L$ to $H_L$ every memory level of the selected memory cell. For example, according to the pattern A, it is the pattern $A_L$ (combination of RC0 and RC3) in the case the memory level of the selected memory cell is (0,0), it is the pattern $A_L$ (combination of RC1 and RC3) and pattern $A_H$ (combination of RC1 and RC0) in the case of (0, 1), it is the pattern $A_L$ (combination of RC2 and RC3) and the pattern $A_H$ (combination of RC2 and RC0) in the case of (1, 0), and it is the pattern $A_H$ (combination of RC3 and RC0) in the case of (1, 1). When the memory level of the selected memory cell is (0, 0), the resistance of the memory cell is low and when it is (1, 1), the resistance of the memory cell is high. Meanwhile, when the memory level is (0, 1) or (1, 0), both low resistance and high resistance memory cells exist. Thus, depending on the memory level of the selected memory cell and the high or low resistance state of the memory level, the distribution patterns (A to H) shown in FIG. 8 correspond to one distribution pattern $A_H$ to $H_H$ or $A_L$ to $H_L$.

Figure 12:
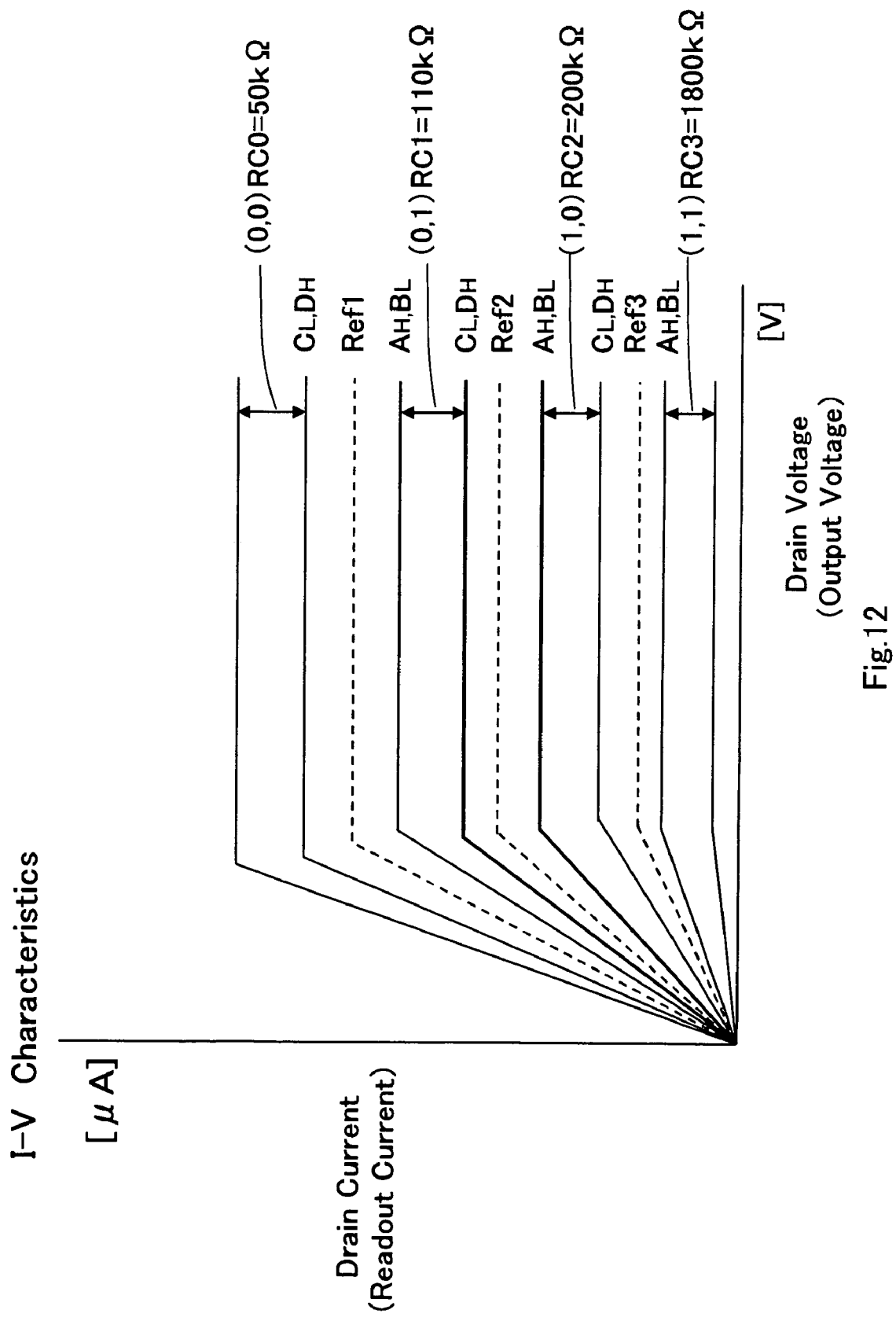
FIG. 12 is a static characteristic view showing I-V characteristics of the memory cell array in the various distribution patterns of the resistance states of the memory cells when 4-level data is stored in the memory cell array.

As shown in FIG. 7, when the memory cell stores 2-level data, if the selected memory cell is in the high resistance state, the leak current in the same direction as the readout current flowing in the selected memory cell becomes largest in the case the distribution pattern of the resistance state of the other unselected memory cell is pattern A, which is the worst case. In addition, if the selected memory cell is in the low resistance state, the leak current in the opposite direction to the readout current flowing in the selected memory cell becomes largest in the case the distribution pattern of the resistance state of the other unselected memory cell is pattern C, which is the worst case. Meanwhile, when the memory cell stores the 4-level data, as shown in FIGS. 12 and 13, as a result of the circuit simulation, when the memory levels of the selected memory cell are (0, 1) and (1, 0), both worst case in which the leak current in the same direction as the readout current flowing in the selected memory cell becomes largest and worst case in which the leak current in the opposite direction to the readout current flowing in the selected memory cell becomes largest exist. When the memory level of the selected memory cell is (0, 0), the leak current in the opposite direction to the readout current flowing in the selected memory cell becomes the largest in the patterns $C_L$ and $D_H$, which is the worst case.

When the memory levels of the selected memory cell are (0, 1) and (1, 0), the leak current in the same direction as the readout current flowing in the selected memory cell becomes the largest in the patterns $A_H$ and $B_L$, which is one of the worst case, and the leak current in the opposite direction to the readout current flowing in the selected memory cell becomes the largest in the patterns $B_H$ and $C_L$, which is the other worst case. When the memory level of the selected memory cell is (1, 1), the leak current in the same direction as the readout current flowing in the selected memory cell becomes the largest in the pattern $A_H$, which is the worst case. That is, when the memory level (0, 0) is read out, the measured current value on the selected global data line becomes the drain current higher than the I-V characteristics $C_L$ and $D_H$ in FIG. 12. When the memory level (0, 1) is read out, the measured current value on the selected global data line becomes the drain current which is the middle of the I-V characteristics $A_H$ and $B_L$, and $C_L$ and $D_H$ in FIG. 12. When the memory level (1, 0) is read out, the measured current value on the selected global data line becomes the drain current which is the middle of the I-V characteristics $A_H$ and $B_L$, and $C_L$ and $D_H$ in FIG. 12. When the memory level (1, 1) is read out, the measured current value on the selected global data line becomes the drain current lower than the I-V characteristics $A_H$ in FIG. 12.

Here, it should be noted that in FIG. 12, the patterns $C_L$ and $D_H$ of the memory level (0, 0) has resistance lower than that of the patterns $A_H$ and $B_L$ of the memory level (0, 1), the patterns $C_L$ and $D_H$ of the memory level (0, 1) has resistance lower than that of the patterns $A_H$ and $B_L$ of the memory level (1, 0), the patterns $C_L$ and $D_H$ of the memory level (1, 0) has resistance lower than that of the patterns $A_H$ and $B_L$ of the memory level (1, 1), and the readout current (the drain current of the load PMOS) between memory levels is not reversed and separated. This is a result of preventing the leak current from being increased by providing the row voltage displacement prevention circuit 31 and the column voltage displacement prevention circuit 41.

The reference memory cell arrays 20a to 20f used in the device of the present invention shown in FIG. 1 will be described. Since 4 levels (0, 0), (0, 1), (1, 0), and (1, 1) are assumed as the memory level in the device of the present invention, there are 3 reference levels as middle values of the memory levels. The first one is a first reference level (Ref1) between the memory levels (0, 0) and (0, 1), the second one is a second reference level (Ref2) between the memory levels (0, 1) and (1, 0), and the third one is a third reference level (Ref3) between the memory levels (1, 0) and (1, 1). According to the device of the present invention as shown in FIG. 1, the pair of reference memory cell arrays and one sense circuit 15 are provided at each reference level.

As shown in FIG. 12, since the measured current value on the selected global data line in each memory level is defined by an upper limit value, a lower limit value or both of them which are defined by the worst case pattern at each memory level, it can be determined that the resistance state corresponding to the memory level of the selected memory cell is which one of the 4 levels (0, 0), (0, 1), (1, 0), and (1, 1) by comparing it with three reference levels, in which the first reference level is set at a middle I-V characteristic (resistance value) between the pattern $C_L$ and $D_H$ of the memory level (0, 0) and the pattern $A_H$ and $B_L$ of the memory level (0, 1), the second reference level is set at a middle I-V characteristic (resistance value) between the pattern $C_L$ and $D_H$ of the memory level (0, 1) and the pattern $A_H$ and $B_L$ of the memory level (1, 0), and the third reference level is set at a middle I-V characteristic (resistance value) between the pattern $C_L$ and $D_H$ of the memory level (1, 0) and the pattern $A_H$ of the memory level (1, 1).

Therefore, one of the reference memory cell arrays 20a and 20b corresponding to the first reference level is set at the pattern $C_L$ and $D_H$ of the memory level (0, 0) and the other is set at the pattern $A_H$ and $B_L$ of the memory level (0, 1). For example, when the reference memory cell array 20a is set at the patterns $A_H$ and $B_L$, and the reference memory cell array 20b is set at the patterns $C_L$ and $D_H$, the reference memory cell array 20a implements a first current state in which the current flowing in the selected data line becomes largest depending on the distribution pattern of the electric resistance state of the other unselected memory cell when the selected memory cell which is in the higher resistance state (memory level (0, 1)) with respect to the first reference level is read out, so as to function as a first reference current generation circuit, and the reference memory cell array 20b implements a second current state in which the current flowing in the selected data line becomes smallest depending on the distribution pattern of the electric resistance state of the other unselected memory cell when the selected memory cell which is in lower resistance state (memory level (0, 0)) with respect to the first reference level is read out, so as to function as a second reference current generation circuit.

Here, since the memory cell has to be selected so that the reference memory cell arrays 20a and 20b may become the predetermined patterns $C_L$ and $D_H$ or $A_H$ and $B_L$, the data line drive circuit 21, the bit line drive circuit 22 and the column decoder 24 provided in the reference memory cell arrays 20a and 20b are set so as to satisfy the above condition.

Similarly, one of the reference memory cell arrays 20c and 20d corresponding to the second reference level is set at the patterns $C_L$ and $D_H$ of the memory level (0, 1) and the other is at the patterns $A_H$ and $B_L$ of the memory level (1, 0). For example, when the reference memory cell array 20c is set at the patterns $A_H$ and $B_L$, and the reference memory cell array 20d is set at the patterns $C_L$ and $D_H$, the reference memory cell array 20c implements a first current state in which the current flowing in the selected data line becomes largest depending on the distribution pattern of the electric resistance state of the other unselected memory cell when the selected memory cell which is in higher resistance state (memory level (1, 0)) with respect to the second reference level is read out, so as to function as a first reference current generation circuit, and the reference memory cell array 20d implements a second current state in which the current flowing in the selected data line becomes smallest depending on the distribution pattern of the electric resistance state of the other unselected memory cell when the selected memory cell which is in lower resistance state (memory level (0, 1)) with respect to the second reference level is read out, so as to function as a second reference current generation circuit.

Here, since the memory cell has to be selected so that the reference memory cell arrays 20c and 20d may become the predetermined patterns $C_L$ and $D_H$ or $A_H$ and $B_L$, the data line drive circuit 21, the bit line drive circuit 22 and the column decoder 24 provided in the reference memory cell arrays 20c and 20d are set so as to satisfy the above condition.

Similarly, one of the reference memory cell arrays 20e and 20f corresponding to the third reference level is set at the pattern $C_L$ and $D_H$ of the memory level (1, 0) and the other is set at the pattern $A_H$ of the memory level (1, 1). For example, when the reference memory cell array 20e is set at the patterns $A_H$, and the reference memory cell array 20f is set at the patterns $C_L$ and $D_H$, the reference memory cell array 20e implements a first current state in which the current flowing in the selected data line becomes largest depending on the distribution pattern of the electric resistance state of the other unselected memory cell when the selected memory cell which is in higher resistance state (memory level (1, 1)) with respect to the third reference level is read out, so as to function as a first reference current generation circuit, and the reference memory cell array 20f implements a second current state in which the current flowing in the selected data line becomes smallest depending on the distribution pattern of the electric resistance state of the other unselected memory cell when the selected memory cell which is in lower resistance state (memory level (1, 0)) with respect to the third reference level is read out, so as to function as a second reference current generation circuit.

Here, since the memory cell has to be selected so that the reference memory cell arrays 20e and 20f may become the predetermined patterns $C_L$ and $D_H$ or $A_H$, the data line drive circuit 21, the bit line drive circuit 22 and the column decoder 24 provided in the reference memory cell arrays 20e and 20f are set so as to satisfy the above condition.

Figure 14:
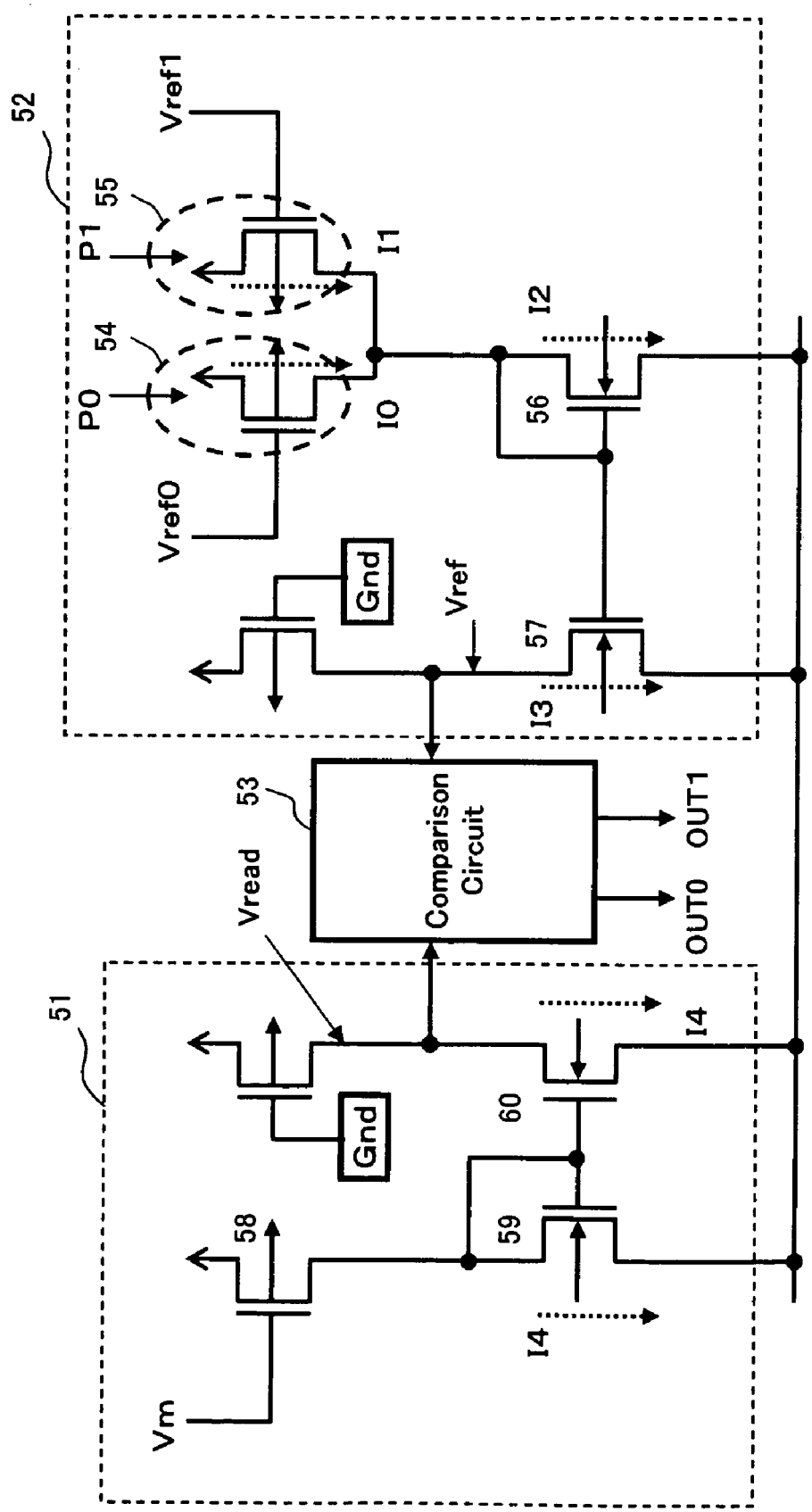
FIG. 14 is a circuit block diagram showing an example of a sense circuit of the semiconductor memory device according to the present invention.
Figure 15:
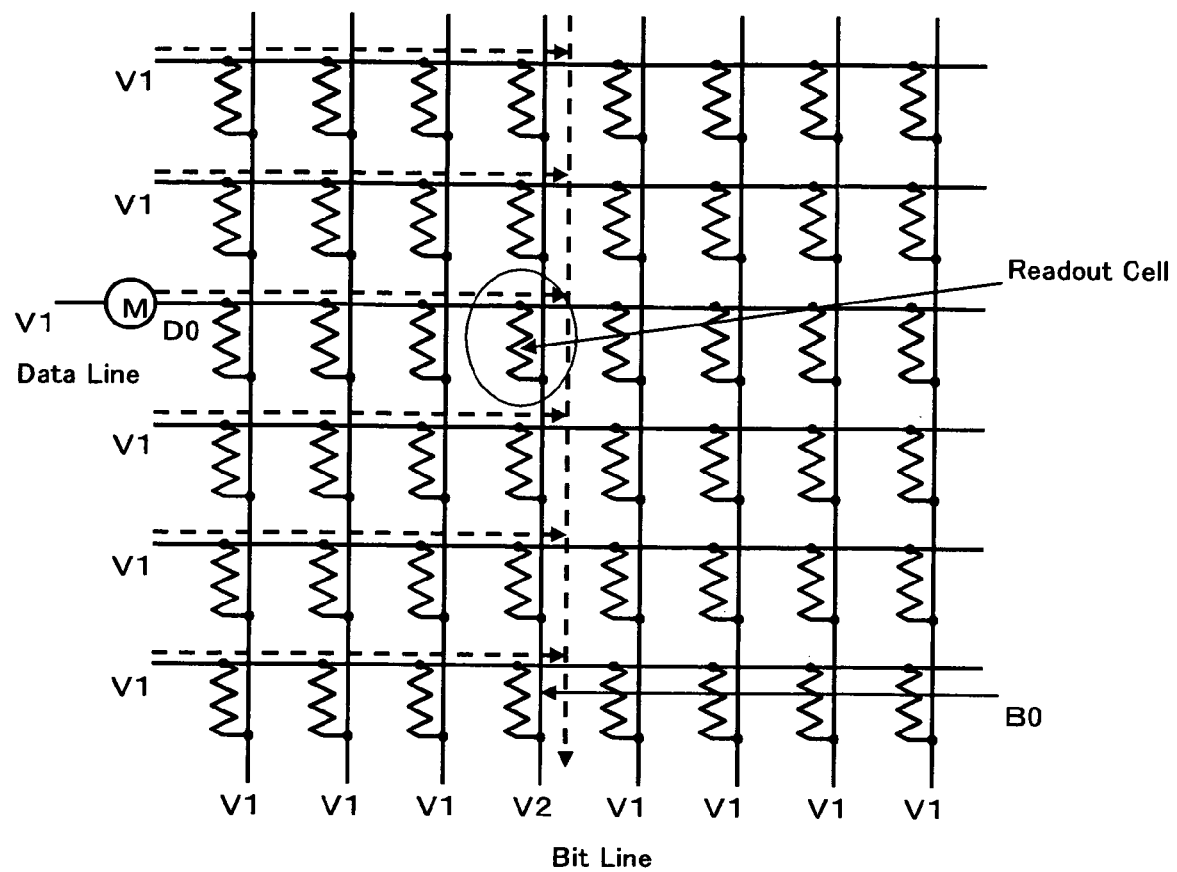
FIG. 15 is a circuit diagram showing a circuit constitution of a memory cell array of a conventional crosspoint memory, set levels of the voltages to data lines and bit lines and current paths.
Figure 16:
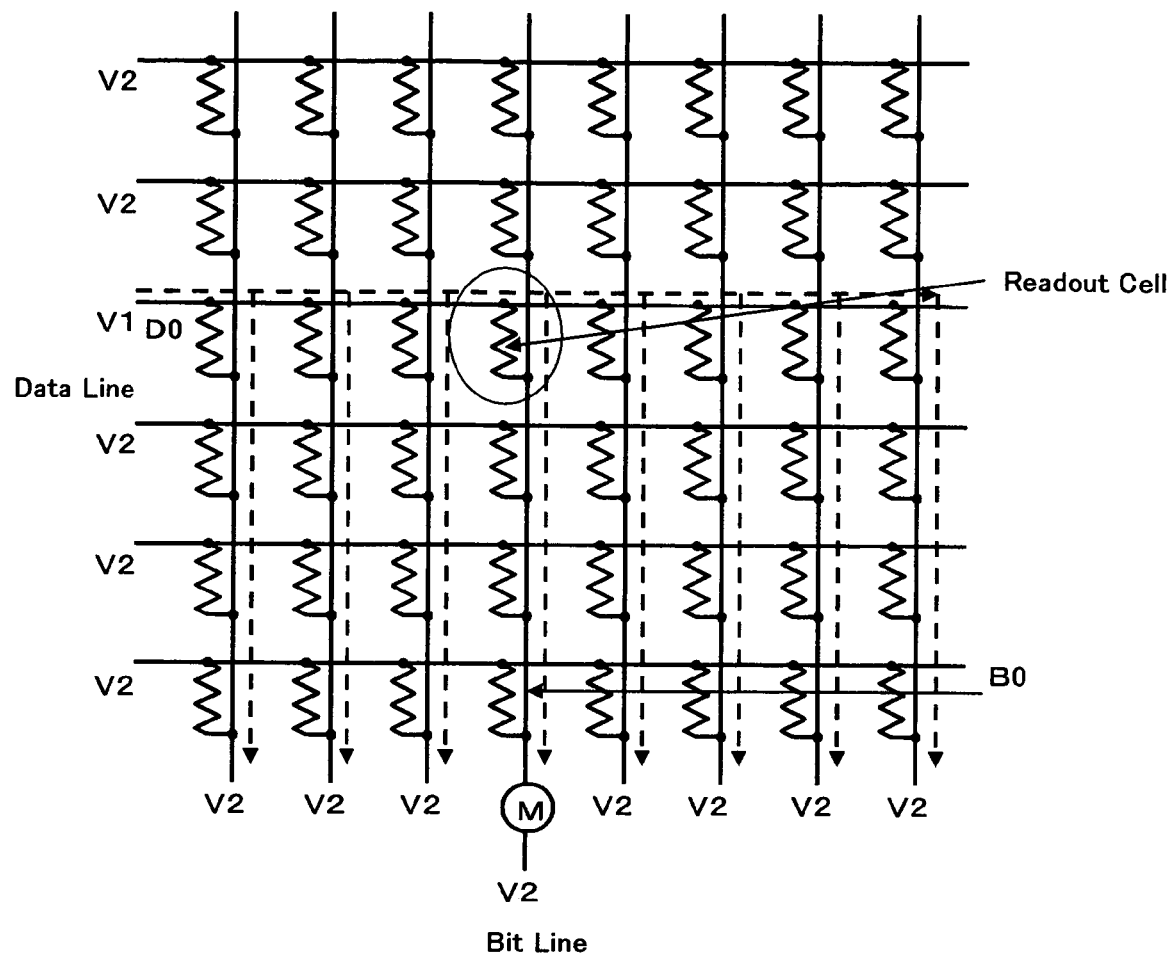
FIG. 16 is a circuit diagram showing data lines, voltage settings of bit lines, current paths when a resistance value of the memory cell at an intersection of a data line D0 and a bit line B0 is read in the memory cell array of the conventional crosspoint memory.

Next, the sense circuit 15 of the device of the present invention will be described. FIG. 14 is a circuit block diagram of the sense circuit 15 corresponding to any one of reference levels. The sense circuit 15 at the first reference level is assumed for convenience of the description. As shown in FIG. 14, the sense circuit 15 comprises a first current-voltage conversion circuit part 51 which reads the current of the selected data line and converts it to the voltage level, a second current-voltage conversion circuit part 52 which converts the current in the middle state between the first current state and the second current state to the reference voltage level, and a comparison circuit 53 which compares the converted readout voltage level with the reference voltage level. Although the pair of reference memory cell arrays 20a and 20b are constituted separately from the sense circuit 15, it may be regarded as a part of the sense circuit 15 substantially.

As shown in FIG. 14, according to the second current-voltage conversion circuit part 52, the output voltage Vref0 of the reference memory cell array 20a is inputted to a gate of the PMOS 54, an output voltage Vref1 of the reference memory cell array 20b is inputted to a gate of the PMOS 55, a composite current I2 of a drain current I0 of the PMOS 54 and a drain current I1 of the PMOS 55 flows in an NMOS 56, a current I3 which is a half of the composite current I2 flows in an NMOS 57 by a current mirror circuit of the NMOS 57 and the MNOS 56 which is set at a half current amount of the NMOS 56, and a reference voltage level Vref is outputted to a drain of the NMOS 57.

Meanwhile, according to the first current-voltage conversion circuit part 51, the output voltage Vm of the memory cell array 10 is inputted to a gate of the PMOS 58, a drain current I4 of the PMOS 58 flows in an NMOS 59, the drain current I4 flows in an MNOS 60 by a current mirror circuit of the NMOS 60 which is equivalent to the MNOS 59, and the MNOS 59, and a readout voltage level Vread is outputted to the drain of the NMOS 60. In addition, the NMOS 57, the NMOS 59, and the NMOS 60 are set at the same current ability.

Memory data of the selected memory cell is determined with respect to one reference level by comparing the readout voltage level Vread generated from the first current-voltage conversion circuit part 51 with the reference voltage level Vref generated from the second current-voltage conversion circuit part 52 by the comparison circuit 53.

The memory cell of the device of the present invention may have any structure or characteristics as long as it is a variable resistive element which stores information by a change in electric resistance. In addition, the changing method of the electric resistances (that is, writing method) is not limited to the electrical method. Furthermore, the memory holding characteristics of the memory cell may be volatile or nonvolatile. In addition, when the device of the present invention is applied to the nonvolatile memory, since high density of the memory cell array can be implemented, large-capacity nonvolatile memory can be implemented.

As examples of the memory cell, there are a phase change memory which uses a phase change in crystal phase (having a low resistance) and amorphous phase (having a high resistance) in a phase change of a phase transition material such as a chalcogenide compound, or polymer memory and polymer ferroelectric RAM in which ferroelectric polarization state is changed by polarization orientation of fluorocarbon resin material molecule (polarized conductive polymer molecule) using a fluorocarbon resin in the memory cell.

In addition, the memory cell of the present invention can be applied to a case where a memory cell is formed of an Mn oxide material such as PCMO ($Pr_{(1-x)}Ca_xMnO_3$) with a perovskite structure which has a CMR (Colossal Magnetic Resistance) effect. This uses a fact that the resistance value of the Mn oxide material such as PCMO which constituting the memory cell element is changed when two phases of ferromagnetic metal and diamagnetic insulator are changed.

In addition, it can be applied to a memory which constitutes a memory cell with metal oxide such as STO ($SrTiO_3$), SZO ($SrZrO_3$) and SRO ($SrRuO_3$) and metal fine particles, and uses an interface phenomenon in which a resistance value of the memory cell varies according to an applied voltage at the interface between the metal oxide and the metal fine particles.

Furthermore, the present invention can be applied to the following memories in a broad sense.

(1) A memory in which a resistive element constituting a memory cell is formed of a semiconductor material.

(2) A memory in which a resistive element constituting a memory cell is formed of an oxide or nitride.

(3) A memory in which a resistive element constituting a memory cell is formed of a compound of metal and semiconductor.

(4) A memory in which a resistive element constituting a memory cell is formed of a fluorocarbon resin material.

(5) A polymer ferroelectric RAM in which a resistive element constituting a memory cell is formed of a conductive polymer.

(6) A memory (OUM) in which a resistive element constituting a memory cell is formed of a chalcogenide material.

(7) A memory in which a resistive element constituting a memory cell is formed of a compound of a perovskite structure having a CMR effect.

(8) An MRAM in which a resistive element constituting a memory cell is formed of a spin dependent tunnel junction element.

SECOND EMBODIMENT

Although a description was made of a case where when the 4-level data of one memory cell is read out by selecting one data line from a selected memory cell array, the three sense circuits 15 are used in parallel to compare its voltage level with three reference levels at the same time according to the first embodiment as shown in FIG. 1, according to this embodiment, a description will be made of a case where one sense circuit 15 is used to change over three reference levels in terms of time in rotation.

Figure 25:
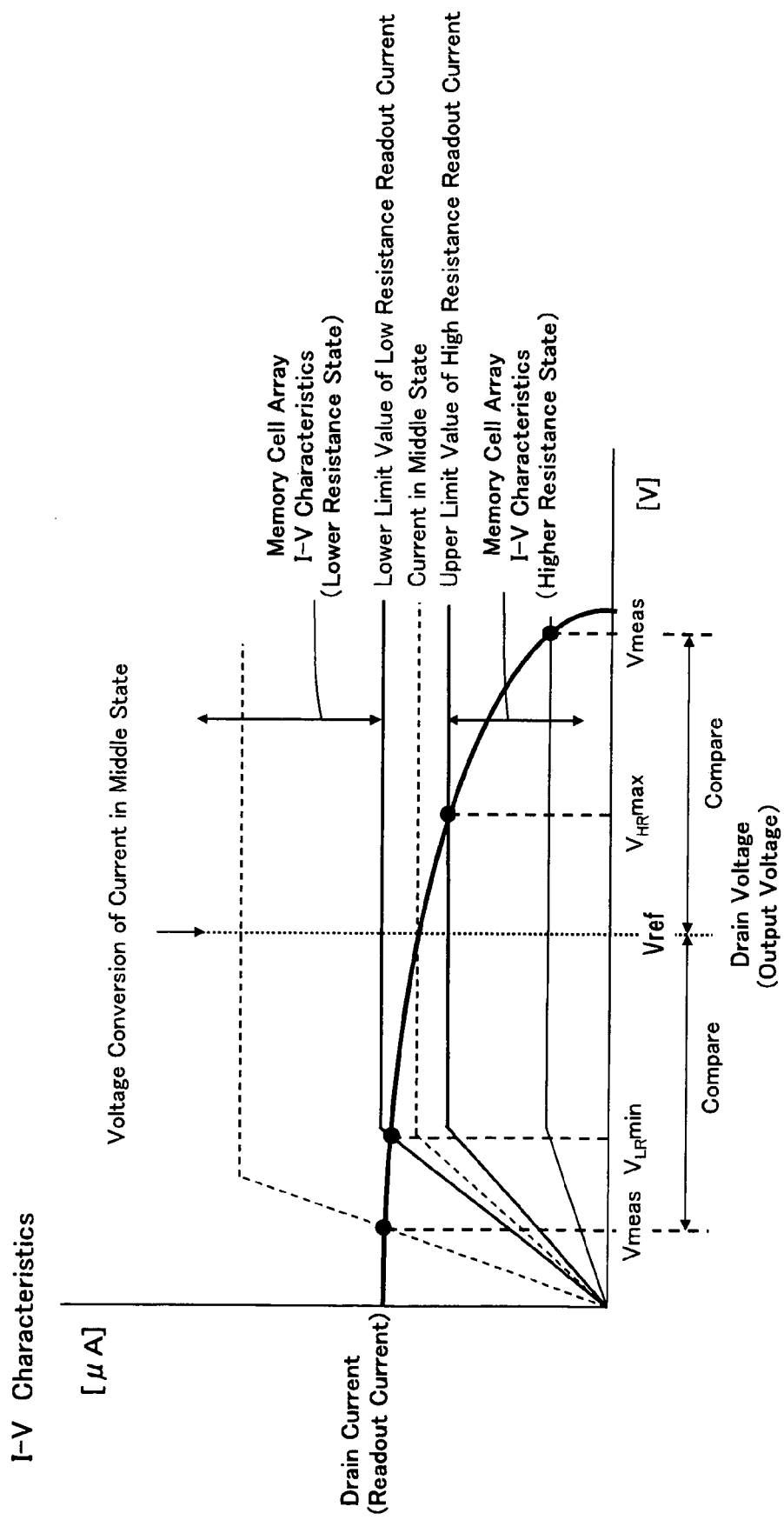
FIG. 25 is a view to explain a relative relation between a reference voltage, a readout current of a selected memory cell and a measured voltage in which the readout current is converted to a voltage level at two levels in a reading method used in a first embodiment of the semiconductor memory device according to the present invention.

According to the readout method in the first embodiment, as shown in FIG. 25, the middle current level between the upper limit value of the readout current of the high resistance memory cell generated in the reference memory cell array when the high resistance memory cell is selected, and the lower limit value of the readout current of the low resistance memory cell generated in the reference memory cell array when the low resistance memory cell is selected is generated, the voltage level converted from the middle current level is used as the reference voltage, and the reference voltage is compared with the measured voltage level converted from the readout current of the selected memory cell, so that the memory data can be read out.

Figure 26:
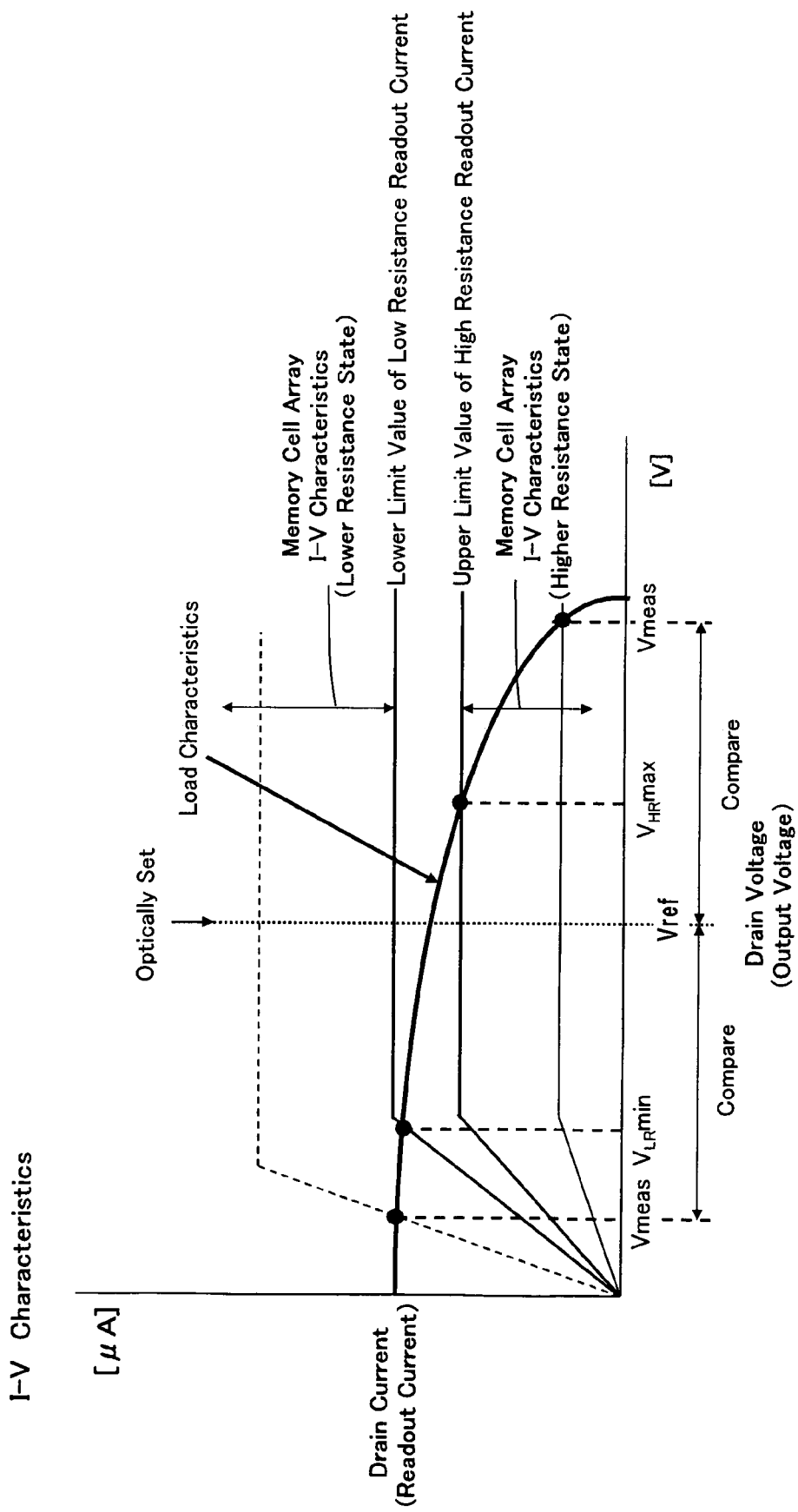
FIG. 26 is a view to explain a relative relation between a reference voltage, a readout current of a selected memory cell and a measured voltage in which the readout current is converted to a voltage level at two levels in a reading method used in a second embodiment of the semiconductor memory device according to the present invention.

According to the second embodiment, as shown in FIG. 26, I-V characteristics of a load resistance are set so as to satisfy the following two equations (7) and (8). First, a readout voltage $V_{HR}$max where the I-V characteristics curve of the load resistance intersects with an upper limit value of a readout current of a high resistance memory cell generated from a reference memory cell array when the high resistance memory cell is selected is set so as to be higher than a reference voltage level Vref (optionally set) of a next-stage sense amplifier.

$$V_{HR}\text{max} > \text{Vref} \quad (7)$$

Secondly, a readout voltage $V_{LR}$min where the I-V characteristics curve of the load resistance intersects with a lower limit value of a readout current of a low resistance memory cell generated from a reference memory cell array when the low resistance memory cell is selected is set so as to be lower than the reference voltage level Vref (optionally set) of the next-stage sense amplifier.

$$\text{Vref} > V_{LR}\text{min} \quad (8)$$

Thus, by using this load resistance, when resistance value of the selected memory cell is low, a relation between a measured voltage Vmeas of the selected memory cell and the readout voltage $V_{LR}$min intersecting with the lower limit value of the readout current of the low resistance memory cell is as shown by the following equation (9)

$$\text{Vmeas} < V_{LR}\text{min} \quad (9)$$

In addition, when resistance value of the selected memory cell is high, a relation between the measured voltage Vmeas of the selected memory cell and the readout voltage $V_{HR}$max intersecting with the upper limit value of the readout current of the high resistance memory cell is as shown by the following equation (10)

$$\text{Vmeas} > V_{HR}\text{max} \quad (10)$$

Figure 27:
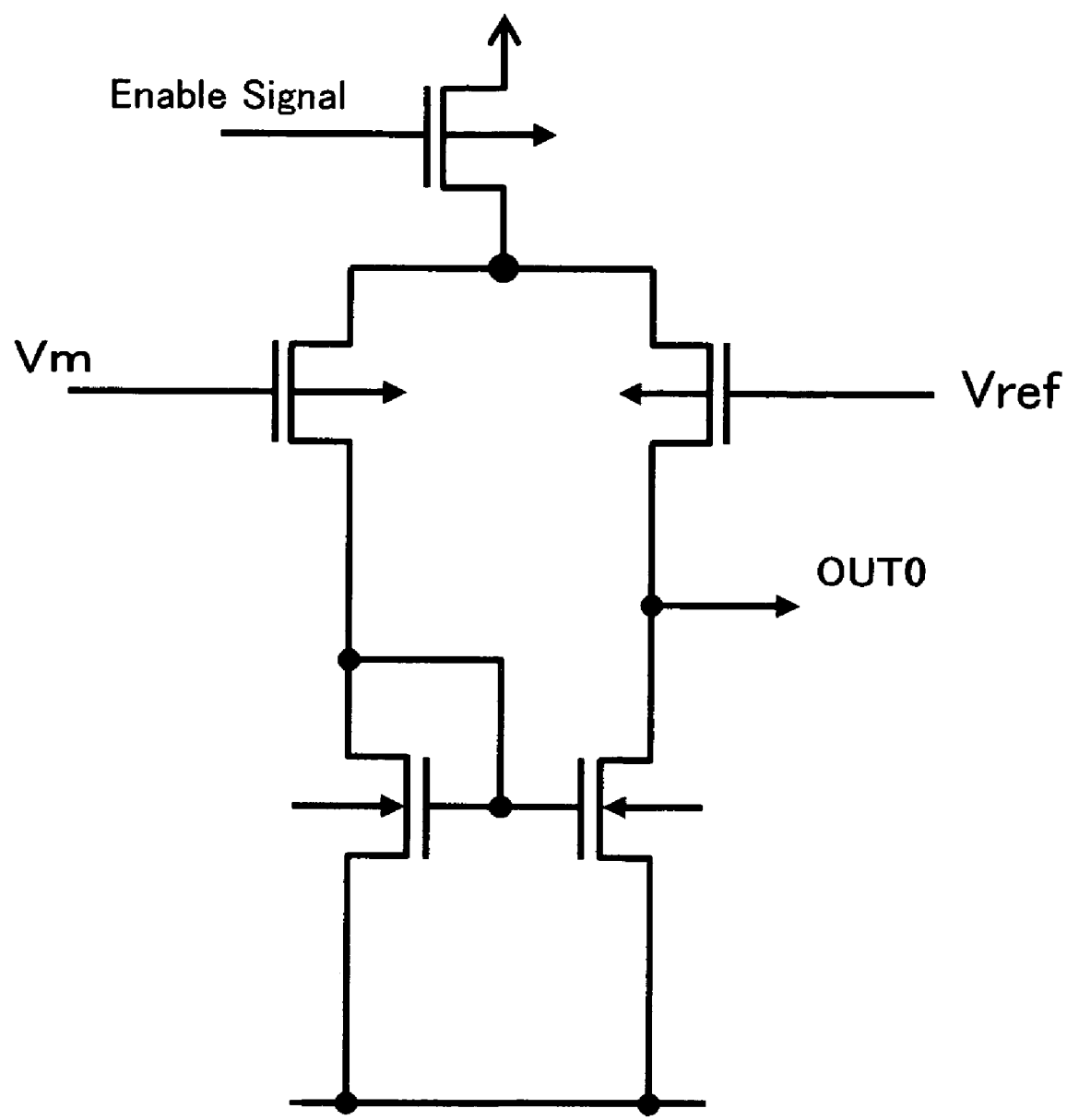
FIG. 27 is a circuit diagram showing an example of a sense amplifier used in the second embodiment of the semiconductor memory device according to the present invention.

Thus, the memory data of the selected memory cell can be read out by using the load resistance having the I-V characteristics which satisfies the above two equations (7) and (8) for the optionally set reference voltage Vref and comparing the reference voltage level Vref with the measured voltage which is converted from the readout current of the selected memory cell to the voltage level, in the next-stage sense amplifier. FIG. 27 shows an example of the sense amplifier used in this case.

Next, a reading sequence when the I-V characteristics of the load resistance is changed over in terms of time to be read out according to a setting method of the load resistance shown in FIG. 26 will be described with reference to FIGS. 28 to 31 mainly.

Figure 28:
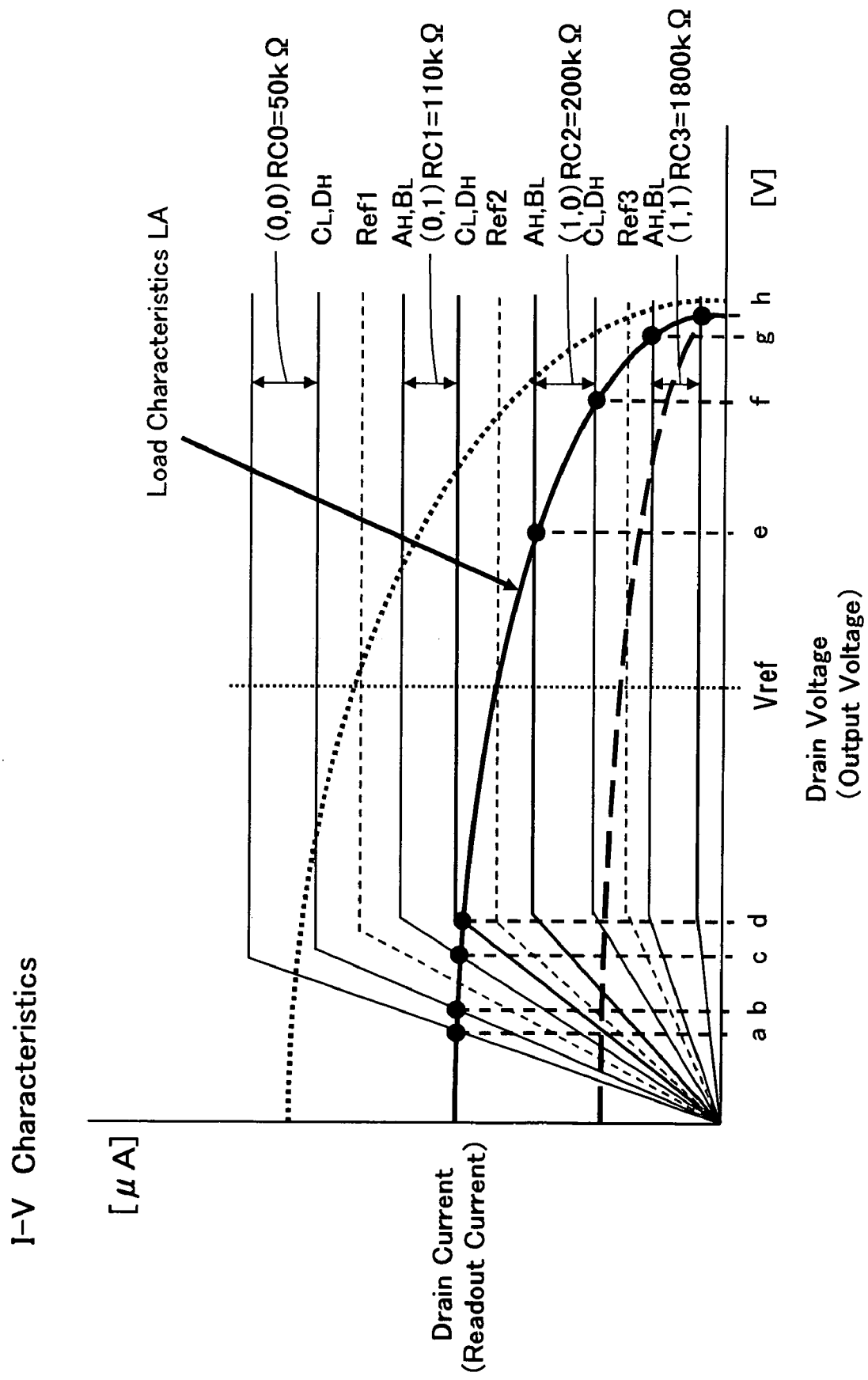
FIG. 28 is a view to explain a relative relation between load characteristics LA of a first PMOS load transistor, a reference voltage, a readout current of a selected memory cell and a measured voltage in which the readout current is converted to a voltage level at four levels in a reading method used in the second embodiment of the semiconductor memory device according to the present invention.

First, the bias level of the PMOS load transistor (refer to the PMOS 30 in FIG. 4) which is the load resistance of the data line drive circuit (refer to FIG. 1) is set. FIG. 28 shows conditions regarding the load characteristics LA in the load characteristics LA, LB, and LC of the three PMOS load transistors.

In order to create the load characteristics LA, the patterns $A_H$ and $B_L$ of the memory level (1, 0) shown in FIG. 8 are arranged in the reference memory cell array 20c, and the patterns $C_L$ and $D_H$ of the memory level (0, 1) shown in FIG. 8 are arranged in the reference memory cell array 20d. Then, the load characteristics LA is set so that the drain voltage (Vm in FIG. 4) of the PMOS load transistor when the memory cell "a" of the pattern $A_H$ or the memory cell "b" of the pattern $B_L$ in the reference memory cell array 20c is selected becomes high level, and the output voltage (Vm in FIG. 4) of the data line drive circuit when the memory cell "c" of the pattern $C_L$ or the memory cell "d" of the pattern $D_H$ in the reference memory cell array 20d is selected becomes low level.

In a case where a certain memory cell is selected using the PMOS load transistor of the load characteristics LA, when the memory data of the memory cell is (0, 0), the output level (Vm in FIG. 4) of the data line drive circuit exists between the voltage levels shown by "a" and "b" in FIG. 28. In addition, when the memory data of the memory cell is (0, 1), the output level of the data line drive circuit exists between the voltage levels shown by "c" and "d" in FIG. 28. In addition, when the memory data of the memory cell is (1, 0), the output level of the data line drive circuit exists between the voltage levels shown by "e" and "f" in FIG. 28, and in addition, when the memory data of the memory cell is (1, 1), the output level of the data line drive circuit exists between the voltage levels shown by "g" and "h" in FIG. 28.

Here, since the optionally set reference voltage level Vref exists between the voltage levels shown by "d" and "e" in FIG. 28, the memory data (0, 0) or (0, 1) and memory data (1, 0) or (1, 1) can be identified by using the PMOS load transistor of the load characteristics LA. The above corresponds to the steps #1 and #2 of the flowchart shown in FIG. 31.

Figure 29:
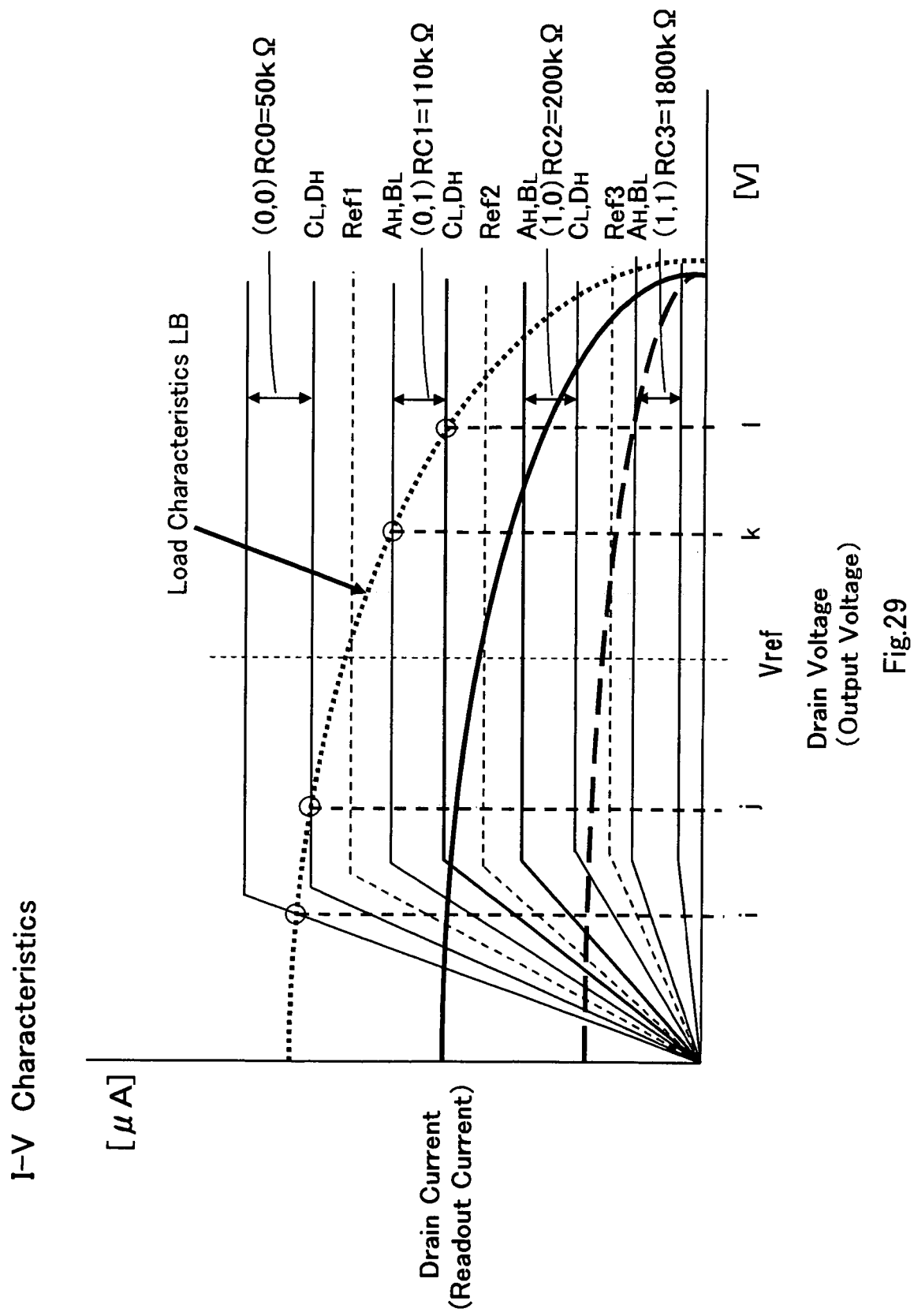
FIG. 29 is a view to explain a relative relation between load characteristics LB of a second PMOS load transistor, a reference voltage, a readout current of a selected memory cell and a measured voltage in which the readout current is converted to a voltage level at four levels for memory data (0, 0) or (0, 1) of a selected memory cell in a reading method used in the second embodiment of the semiconductor memory device according to the present invention.

As a result, when it is determined that the memory data is (0, 0) or (0, 1), the load characteristics of the PMOS load transistor to be set next is the load characteristics LB shown in FIG. 29.

In order to create the load characteristics LB, the patterns $A_H$ and $B_L$ of the memory level (0, 1) shown in FIG. 8 are arranged in the reference memory cell array 20a, and the patterns $C_L$ and $D_H$ of the memory level (0, 0) shown in FIG. 8 are arranged in the reference memory cell array 20b. Then, the load characteristics LB is set so that the output voltage (Vm in FIG. 4) of the data line drive circuit when the memory cell "a" of the pattern $A_H$ or the memory cell "b" of the pattern $B_L$ in the reference memory cell array 20a is selected becomes a high level, and the output voltage of the data line drive circuit when the memory cell "c" of the pattern $C_L$ or the memory cell "d" of the pattern $D_H$ in the reference memory cell array 20b is selected becomes a low level.

In a case where a certain memory cell whose memory data is determined as (0, 0) or (0, 1) at the step #2 (refer to FIG. 31) is selected using the PMOS load transistor of the load characteristics LB, when the memory data of the memory cell is (0, 0), the output level (Vm in FIG. 4) of the data line drive circuit exists between the voltage levels shown by "i" and "j" in FIG. 29. In addition, when the memory data of the memory cell is (0, 1), the output level of the data line drive circuit exists between the voltage levels shown by "k" and "l" in FIG. 29.

Here, since the optionally set reference voltage level Vref of the next-stage sense amplifier exists between the voltage levels shown by "j" and "k" in FIG. 29, when the output level of the data line drive circuit exists between the "i" and "j", the next-stage sense amplifier outputs the low level. Alternatively, when the output level of the data line drive circuit exists between the "k" and "l", the next-stage sense amplifier outputs the high level. The above corresponds to the steps #3 to #6 of the flowchart shown in FIG. 31.

Figure 30:
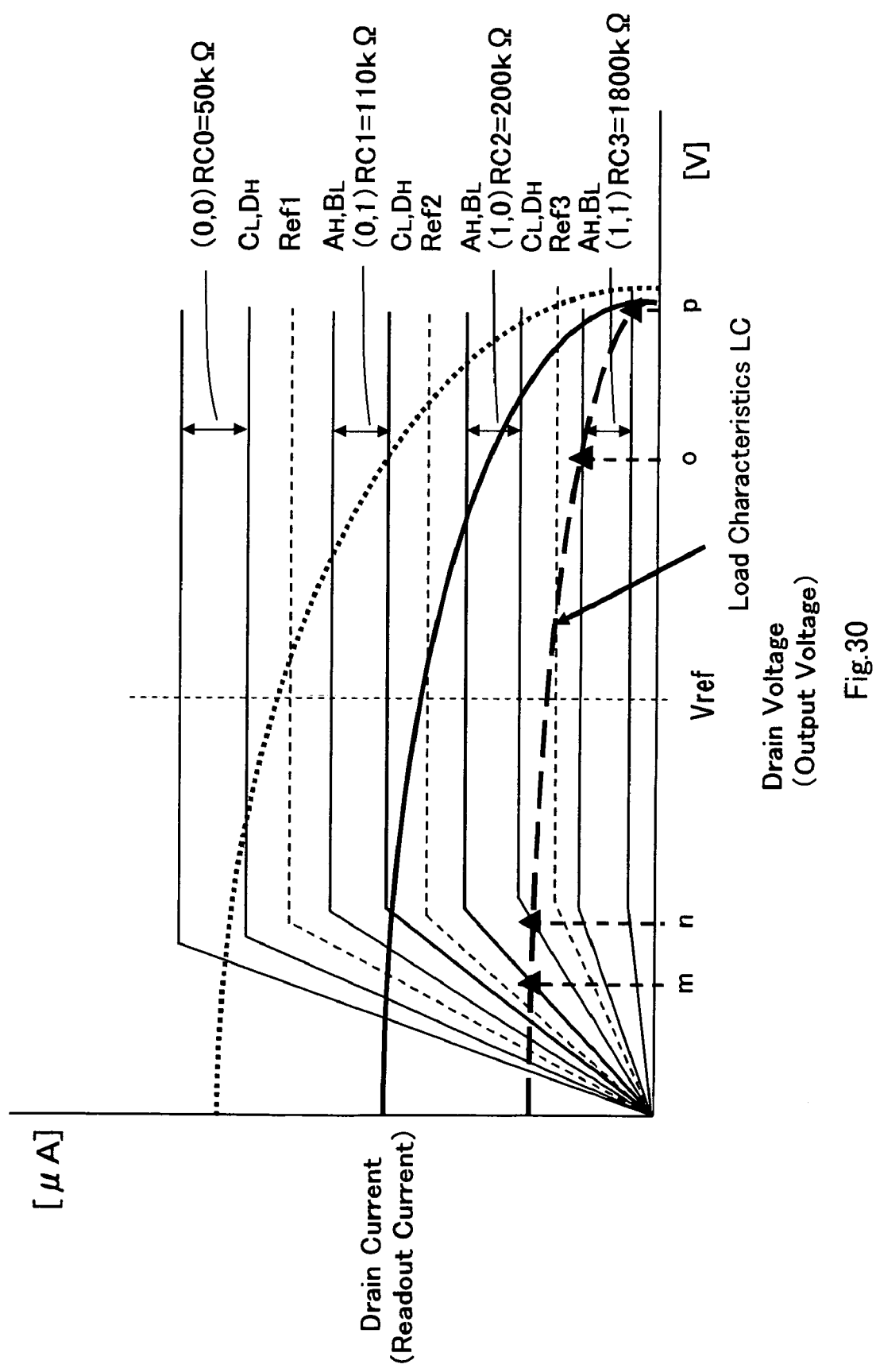
FIG. 30 is a view to explain a relative relation between load characteristics LC of a third PMOS load transistor, a reference voltage, a readout current of a selected memory cell and a measured voltage in which the readout current is converted to a voltage level at four levels for memory data (1, 0) or (1, 1) of a selected memory cell in a reading method used in the second embodiment of the semiconductor memory device according to the present invention.
Figure 31:
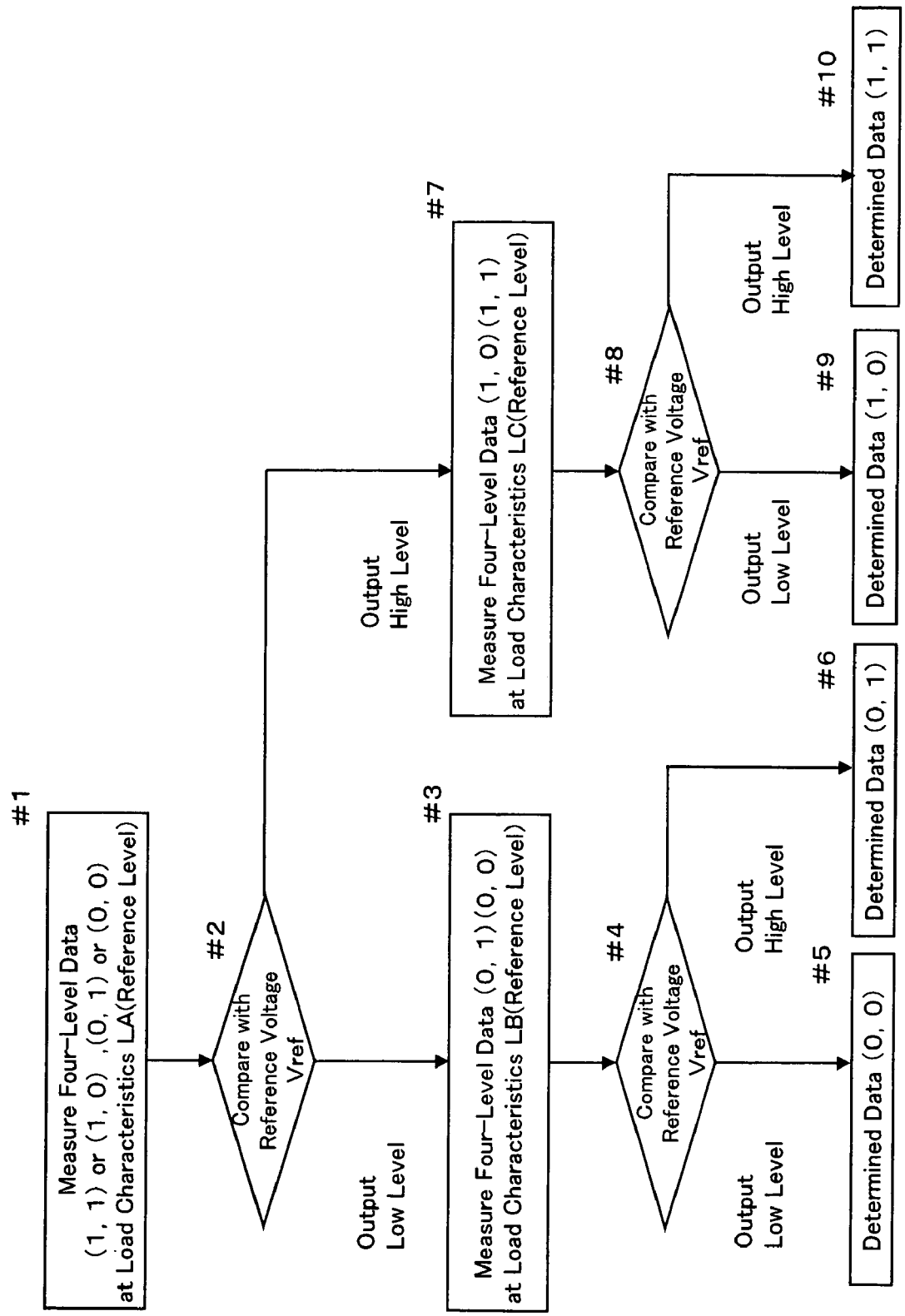
FIG. 31 is a flowchart showing an identification sequence of 4-level data in the readout method used in the second embodiment of the semiconductor memory device according to the present invention.

Next, when it is determined that the memory data is (1, 0) or (1, 1) at the step #2 (refer to FIG. 31), the load characteristics of the PMOS load transistor to be set next is the load characteristics LC shown in FIG. 30.

In order to create the load characteristics LC, the patterns $A_H$ and $B_L$ of the memory level (1, 1) shown in FIG. 8 are arranged in the reference memory cell array 20e, and the patterns $C_L$ and $D_H$ of the memory level (1, 0) shown in FIG. 8 are arranged in the reference memory cell array 20f. Then, the load characteristics LC is set so that the output voltage (Vm in FIG. 4) of the data line drive circuit when the memory cell "a" of the pattern $A_H$ or the memory cell "b" of the pattern $B_L$ in the reference memory cell array 20e is selected becomes a high level, and the output voltage of the data line drive circuit when the memory cell "c" of the pattern $C_L$ or the memory cell "d" of the pattern $D_H$ in the reference memory cell array 20f is selected becomes a low level.

In a case where a memory cell whose memory data is determined as (1, 0) or (1, 1) at the step #2 (refer to FIG. 31) is selected using the P channel load transistor of the load characteristics LC, when the memory data of the memory cell is (1, 0), the output level (Vm in FIG. 4) of the data line drive circuit exists between the voltage levels shown by "m" and "n" in FIG. 30. In addition, when the memory data of the memory cell is (1, 1), the output level of the data line drive circuit exists between voltage levels shown by "o" and "p" in FIG. 30.

Here, since the optionally set reference voltage level Vref of the next-stage sense amplifier exists between voltage levels shown by "n" and "o" in FIG. 30, when the output level of the data line drive circuit exists between the "m" and "n", the next-stage sense amplifier outputs the low level. Alternatively, when the output level of the data line drive circuit exists between the "o" and "p", the next-stage sense amplifier outputs the high level. The above corresponds to the steps #7 to #10 of the flowchart shown in FIG. 31.

Another embodiment of the device of the present invention will be described hereinafter.

Although the array size of the memory cell array 10 is the same as that of each of the reference memory cell arrays 20a to 20f in the above embodiments, the distribution pattern of the resistance state of the worst case in which the leak current is increased in the same direction or the opposite direction of the readout current in the reference memory cell array having the same array size may be implemented in a smaller array size as a simulation. Alternatively, each of the reference memory cell arrays 20a to 20f may comprise an independent memory cell and a resistance value to which the maximum lead current in the same direction or the opposite direction of the readout current is added may be set in each memory cell.

Although as the first reference current generation circuit and the second reference current generation circuit for the first reference level, the reference memory cell array 20a set in the patterns $A_H$ and $B_L$ and the reference memory cell array 20b set in the patterns $C_L$ and $D_H$ are used in the above embodiments, as the first reference current generation circuit and the second reference current generation circuit, a reference memory cell array having another array size which can implement each of the first current state and the second current state may be employed. For example, unselected memory cells in the same resistance state may be combined. The same goes for the first reference current generation circuit and the second reference current generation circuit for the second or the third reference level.

In addition, as the resistance states corresponding to the multi-level (4-level) memory of the memory cell, although they are assumed such that RC0=50 kΩ, RC1=110 kΩ, RC2=200 kΩ, and RC3=1800 kΩ, the resistance values are not limited to the above. In addition, when the above resistance values are changed, the distribution patterns of the worst case employed by the reference memory cell arrays 20a to 20f may be appropriately changed from those in the above embodiments.

In addition, although the four-level memory was assumed as the multi-level memory, the multi-level memory is not limited to 4-level memory.

Although description was made of the case where the data of one memory cell is read out by selecting one data line from the selected memory cell array 10 in the above embodiments as shown in FIG. 1, data of the plurality of memory cells may be read out by selecting the plurality of data lines from the memory cell array 10. In this case, although it is necessary to increase the number of the sense circuits 15 by the same number as that of the memory cells to be read out at the same time, three or one sense circuit 15 is enough when the memory cells are read out serially. In addition, when the sense circuit 15 is increased to the same number as that of the memory cells to be read at the same time, the reference memory cell arrays 20a to 20f may be shared among the increased sense circuits 15.

Although the row direction of the memory cell array is set in the lateral direction and the column direction thereof is set in the vertical direction in each drawing, the relation between the row and the column may be exchanged with each other. That is, at the time of readout, the sense circuit may be constituted so as to be able to sense the current flowing in the selected column selection line separately from a current flowing in the unselected column selection line. In addition, although the column voltage displacement prevention circuit and the row voltage displacement prevention circuit are provided for the column selection line and the row selection line of the memory cell array, respectively in the above embodiments, either the column voltage displacement prevention circuit or the row voltage displacement prevention circuit may be provided.

Although the first voltage supplied to the selected bit line is set lower than the second voltage supplied to the unselected bit lines and the data lines in the above embodiment, the first voltage may be set higher than the second voltage. In addition, the first and second voltages may be a voltage other than the ground voltage and the power supply voltage.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A semiconductor memory device comprising:
a memory cell array in which memory cells each comprising variable resistive elements which store three or more multi-level information depending on a change in electric resistance are arranged in row direction and column direction, a plurality of row selection lines extending in the row direction and a plurality of column selection lines extending in the column direction are provided, respective one ends of the variable resistive elements of the memory cells in the same row are connected to the same row selection line and respective the other ends of the variable resistive elements of the memory cells in the same column are connected to the same column selection line;
a column readout voltage supply circuit which supplies a predetermined first voltage when readout is selected, and supplies a second voltage different from the first voltage when the readout is not selected, to each of the column selection lines;
a row readout voltage supply circuit which supplies the second voltage to each of the row selection lines at the time of readout; and
a sense circuit which senses a current flowing in a selected row selection line separately from a current flowing in unselected row selection lines and senses an electric resistance state of a selected memory cell at the time of readout; wherein
each reference level between two adjacent memory levels when the memory levels of multi-level information stored in the memory cell are arranged in order of size of resistance values of the corresponding variable resistive element in a distribution range is defined by a reference current in a middle state between a first current state in which a current flowing in the row selection line selected when a high resistance memory cell in which the electric resistance of the selected memory cell is in a higher resistance state in the two adjacent memory levels is read out, becomes the largest state depending on a distribution pattern of an electric resistance state of the other unselected memory cell in the memory cell array, and a second current state in which a current flowing in the row selection line selected when a low resistance memory cell in which the electric resistance of the selected memory cell is in a lower resistance state in the adjacent two memory levels is read out, becomes the smallest state depending on the distribution pattern of the electric resistance state of the other unselected memory cell in the memory cell array, and
the sense circuit is constituted so as to be able to compare the current flowing in the selected row selection line with the reference current corresponding to the reference level.

2. The semiconductor memory device according to claim 1, wherein
the sense circuit comprises:
a first current-voltage conversion circuit part which converts the current flowing in the selected row selection line to a readout voltage level;
a first reference current generation circuit which approximately implements the first current state of each reference level;
a second reference current generation circuit which approximately implements the second current state of each reference level;
a second current-voltage conversion circuit part which converts the reference current of the reference level to a reference voltage level; and
a comparison circuit which compares the readout voltage level with the reference voltage level.

3. The semiconductor memory device according to claim 2, wherein
each of the first reference current generation circuit and the second reference current generation circuit at each reference level comprises a reference memory cell array comprising reference memory cells formed of the same variable resistive elements as the memory cells and having the equivalent constitution to the memory cell array, a reference column readout voltage supply circuit whose constitution is equivalent to that of the column readout voltage supply circuit, and a reference row readout voltage supply circuit whose constitution is equivalent to that of the row readout voltage supply circuit,
a distribution pattern of an electric resistance state of the reference memory cell in the reference memory cell array in the first reference current generation circuit at each reference level is set in a first distribution pattern in which the current flowing in the row selection line at the selected reference memory cell array becomes the first current state of each reference level, and
a distribution pattern of an electric resistance state of the reference memory cell in the reference memory cell array in the second reference current generation circuit at each reference level is set in a second distribution pattern in which the current flowing in the row selection line of the selected reference memory cell array becomes the second current state at each reference level.

4. The semiconductor memory device according to claim 3, wherein
the numbers of the reference memory cells, the row selection lines and the column selection lines in the reference memory cell array is the same as those of the memory cells, the row selection lines and the column selection lines in the memory cell array.

5. The semiconductor memory device according to claim 2, further comprising:
the plurality of memory cell arrays, wherein
the sense circuit for at least two memory cell arrays in the plurality of memory cell arrays uses the first reference current generation circuit and the second reference current generation circuit in common.

6. The semiconductor memory device according to claim 1, wherein
the memory cell comprises a nonvolatile variable resistive element which can be electrically rewritten.

7. The semiconductor memory device according to claim 1, wherein
the memory cell is arranged at an intersection of the row selection line and the column selection line.

8. The semiconductor memory device according to claim 1, wherein
when the first voltage is lower than the second voltage, each of the column readout voltage supply circuit and the row readout voltage supply circuit supplies the second voltage through a P channel MOSFET which operates in a saturation region.

* * * * *